US012107393B2

(12) United States Patent
Nagano et al.

(10) Patent No.: US 12,107,393 B2
(45) Date of Patent: *Oct. 1, 2024

(54) SEMICONDUCTOR LASER ELEMENT, TESTING METHOD, AND TESTING DEVICE

(71) Applicant: Nuvoton Technology Corporation Japan, Kyoto (JP)

(72) Inventors: Kazumasa Nagano, Toyama (JP); Hiroki Nagai, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/486,776

(22) Filed: Oct. 13, 2023

(65) Prior Publication Data

US 2024/0055830 A1     Feb. 15, 2024

Related U.S. Application Data

(63) Continuation of application No. 17/158,557, filed on Jan. 26, 2021, now Pat. No. 11,824,326, which is a
(Continued)

(30) Foreign Application Priority Data

Jul. 27, 2018    (JP) ................................. 2018-141144

(51) Int. Cl.
    *H01S 5/00*        (2006.01)
    *H01S 5/02*        (2006.01)
    (Continued)

(52) U.S. Cl.
    CPC ............ *H01S 5/162* (2013.01); *H01S 5/0021* (2013.01); *H01S 5/0207* (2013.01); *H01S 5/026* (2013.01);
(Continued)

(58) Field of Classification Search
    CPC ...... H01S 5/162; H01S 5/0021; H01S 5/0207; H01S 5/026; H01S 5/3434; H01S 5/0014; H01S 5/22; H01S 5/3202
    See application file for complete search history.

(56) References Cited

U.S. PATENT DOCUMENTS 4,875,216 A * 10/1989 Thornton ............... B82Y 20/00
                                                           372/45.01
5,446,537 A     8/1995   Yoshida et al.
                (Continued)

FOREIGN PATENT DOCUMENTS

JP     H07-079051 A     3/1995
JP     H07-115250 A     5/1995
              (Continued)

OTHER PUBLICATIONS

International Search Report and Written Opinion issued on Oct. 21, 2019 in International Application No. PCT/JP2019/028568; with partial English translation.
(Continued)

*Primary Examiner* — Kinam Park
(74) *Attorney, Agent, or Firm* — Rimon P.C.

(57) ABSTRACT

A semiconductor laser element that includes a semiconductor layer including a waveguide formed in an intra-layer direction of the semiconductor layer and a window region formed in a front-side end face of the waveguide, has a current-laser optical output characteristic in which, at an operating temperature of 25° C.±3° C., a laser optical output has a maximum value at a first driving current value and the laser optical output is at most 20% of the maximum value at a second driving current value greater than the first driving current value, and is not damaged at the second driving current value.

20 Claims, 17 Drawing Sheets

FIRST DIRECTION ⟶

Related U.S. Application Data continuation of application No. PCT/JP2019/028568, filed on Jul. 19, 2019.

(51) Int. Cl.
*H01S 5/026* (2006.01)
*H01S 5/16* (2006.01)
*H01S 5/343* (2006.01)
*H01S 5/22* (2006.01)
*H01S 5/32* (2006.01)

(52) U.S. Cl.
CPC .......... *H01S 5/3434* (2013.01); *H01S 5/0014* (2013.01); *H01S 5/22* (2013.01); *H01S 5/3202* (2013.01)

(56) References Cited

U.S. PATENT DOCUMENTS

| | | | | |
|---|---|---|---|---|
| 5,617,957 | A * | 4/1997 | Yoshida | H01S 5/0021 209/571 |
| 5,987,046 | A * | 11/1999 | Kobayashi | H01S 5/026 372/45.01 |
| 11,824,326 | B2 * | 11/2023 | Nagano | H01S 5/162 |
| 2004/0120378 | A1 * | 6/2004 | Tanaka | B82Y 20/00 372/45.01 |
| 2006/0039430 | A1 * | 2/2006 | Yamada | H01S 5/028 372/43.01 |
| 2007/0026620 | A1 * | 2/2007 | Yamada | H01S 5/162 438/308 |
| 2008/0043797 | A1 * | 2/2008 | Takayama | H01S 5/22 372/50.12 |
| 2008/0080580 | A1 * | 4/2008 | Takayama | H01S 5/4031 438/35 |
| 2012/0147916 | A1 * | 6/2012 | Noma | H01S 5/3202 372/45.01 |
| 2019/0131770 | A1 * | 5/2019 | Ikedo | H01S 5/0421 |
| 2020/0169058 | A1 * | 5/2020 | Sato | H01S 5/0203 |

FOREIGN PATENT DOCUMENTS

| | | |
|---|---|---|
| JP | 10-303496 A | 11/1998 |
| JP | 2004-087836 A | 3/2004 |
| JP | 2004-319914 A | 11/2004 |
| JP | 2006-165394 A | 6/2006 |
| JP | 2008-091708 A | 4/2008 |
| JP | 2008-124120 A | 5/2008 |
| JP | 2013-034034 A | 2/2013 |
| JP | 2013-247210 A | 12/2013 |
| WO | 2019/026953 A1 | 2/2019 |

OTHER PUBLICATIONS

Non-Final Office Action dated Feb. 2, 2023 issued in U.S. Appl. No. 17/158,557.

Notice of Allowance dated Jul. 19, 2023 issued in U.S. Appl. No. 17/158,557.

* cited by examiner

FIRST DIRECTION →

SEMICONDUCTOR LASER ELEMENT, TESTING METHOD, AND TESTING DEVICE

CROSS REFERENCE TO RELATED APPLICATIONS

This application is a Continuation Application of Ser. No. 17/158,557, filed on Jan. 26, 2021, which is a Continuation of International Patent Application Number PCT/JP2019/028568, filed on Jul. 19, 2019, claiming the benefit of priority of Japanese Patent Application Number 2018-141144, filed on Jul. 27, 2018, the entire contents of which are hereby incorporated by reference.

BACKGROUND

1. Technical Field

The present disclosure relates to a semiconductor laser element, a testing method, and a testing device.

2. Description of the Related Art

Conventionally, semiconductor laser elements have been known as small and high-output light sources. Screenings are conducted for ensuring the reliability of such semiconductor laser elements (for example, see Japanese Unexamined Patent Application Publication No. 10-303496). The method of screening the semiconductor laser elements which is disclosed in PTL 1 aims to reduce the time required for the screening by increasing a current value supplied to the semiconductor laser element to a value much greater than a current value that saturates an optical output of the semiconductor laser element.

SUMMARY

In the screening method of screening a semiconductor laser element disclosed in PTL 1, the screening of the semiconductor laser element is conducted at the ambient temperature higher than room temperature so that laser optical outputs of the semiconductor laser element are lower than laser optical outputs of a semiconductor laser element in the case in which the screening is conducted in the room temperature, thereby reducing catastrophic optical damage (COD) to an end face of the semiconductor laser element during the screening. However, the time required for the screening increases due to low laser driving currents. As such, end-face damage of a semiconductor laser element poses problems not only during the normal use of the semiconductor laser element, but also during screenings. The present disclosure aims to solve such problems and to provide a semiconductor laser element etc. which can prevent end-face damage.

In order to provide such a semiconductor laser element, a semiconductor laser element according to the present disclosure includes a semiconductor layer, and the semiconductor layer includes a waveguide formed in an intra-layer direction of the semiconductor layer and a window region formed in a front-side end face of the waveguide. The semiconductor laser element has a current-laser optical output characteristic in which, at an operating temperature of 25° C.±3° C., a laser optical output has a maximum value at a first driving current value and the laser optical output is at most 20% of the maximum value at a second driving current value greater than the first driving current value. The semiconductor laser element is not damaged at the second driving current value.

In addition, in the semiconductor laser element according to the present disclosure, the laser optical output may be at most 100 mW at the second driving current value.

Moreover, in the semiconductor laser element according to the present disclosure, the laser optical output may be at most 50 mW at the second driving current value.

In addition, in the semiconductor laser element according to the present disclosure, laser oscillation may stop at the second driving current value.

Moreover, in the semiconductor laser element according to the present disclosure, the laser optical output may be at least 95% of the maximum value at the first driving current value when the semiconductor laser element is driven for the second time at the first driving current value after the semiconductor laser element is driven at the second driving current value.

In addition, in the semiconductor laser element according to the present disclosure, the laser optical output may be at least twice an absolute maximum rated optical output at the first driving current value when the semiconductor laser element is driven for the second time at the first driving current value after the semiconductor laser element is driven at the second driving current value.

Moreover, in the semiconductor laser element according to the present disclosure, drive at the first driving current value and drive at the second driving current value each may be pulse drive of at least 0.1 µs and at most 1 µs.

In addition, in the semiconductor laser element according to the present disclosure, a resonator length of the semiconductor laser element may be at most 300 µm.

Moreover, in the semiconductor laser element according to the present disclosure, an oscillation wavelength of the semiconductor laser element may be at least 780 nm and at most 860 nm.

In addition, the semiconductor laser element according to the present disclosure may include a substrate above which the semiconductor layer is disposed, the substrate containing GaAs. The semiconductor layer may include, sequentially above the substrate, an n-type clad layer containing n-type AlGaInP, an n-side light guiding layer, an active layer including a quantum well structure, a p-side light guiding layer, and a p-type clad layer containing p-type AlGaInP. The quantum well structure may be interposed between the p-side light guiding layer and the n-side light guiding layer, and may include a plurality of well layers and a plurality of barrier layers containing AlGaAs. The p-side light guiding layer and the n-side light guiding layer each may contain $Al_yGa_zIn_{(1-y-z)}P$, y being at least 0 and at most 0.1, z being at least 0 and at most 0.9, y+z being at least 0.3 and at most 0.7.

Moreover, in the semiconductor laser element according to the present disclosure, the plurality of well layers may contain GaAs, InGaAs, or GaAsP.

In addition, in the semiconductor laser element according to the present disclosure, the window region may include a window region formation impurity. A distance from an active layer lower end to a diffusion end of the window region formation impurity in the window region may be at least 0.5 µm, the active layer lower end being a boundary between the n-side light guiding layer and the active layer, the diffusion end being closer to the substrate.

Moreover, in the semiconductor laser element according to the present disclosure, the window region may include a disordered region in which a portion of the quantum well structure is disordered. A difference between an energy band gap in the disordered region and an energy band gap in a remaining portion of the quantum well structure may be at least 30 meV.

In addition, in the semiconductor laser element according to the present disclosure, a peak wavelength of a spectrum from the window region may be at least 30 nm shorter than the oscillation wavelength, the peak wavelength of the spectrum being obtained by a photoluminescence method or a cathodoluminescence method.

Moreover, in the semiconductor laser element according to the present disclosure, a peak concentration of the window region formation impurity of a portion located in the window region within the active layer may be at least $7 \times 10^{18}/cm^3$ and at most $1 \times 10^{19}/cm^3$.

In addition, in order to solve such problems as described above, a testing method according to the present disclosure is a testing method for determining whether a semiconductor laser element to be tested is defective. The semiconductor laser element to be tested includes a semiconductor layer, and the semiconductor layer includes a waveguide formed in an intra-layer direction of the semiconductor layer and a window region formed in a front-side end face of the waveguide. The testing method includes: measuring a characteristic of the semiconductor laser element to be tested; energizing the semiconductor laser element to be tested at a second driving current value after the measuring, the second driving current value being greater than a first driving current value at which a laser optical output of the semiconductor laser element to be tested has a maximum value and being a value at which the laser optical output is at most 20% of the maximum value; remeasuring the characteristic of the semiconductor laser element to be tested after the energizing; and determining whether the semiconductor laser element to be tested is defective by comparing the characteristic of the semiconductor laser element to be tested which is obtained in the measuring with the characteristic of the semiconductor laser element to be tested which is obtained in the remeasuring.

Moreover, in the testing method according to the present disclosure, the second driving current value specific to the semiconductor element to be tested may be determined based on the characteristic obtained in the measuring.

In addition, in the testing method according to the present disclosure, in the measuring, a current value that is supplied to the semiconductor laser element to be tested when the laser optical output is a first output may be a first test current value Ia, and in the remeasuring, a current value that is supplied to the semiconductor laser element to be tested when the laser optical output is the first output may be a second test current value Ib. The determining may include determining that the semiconductor laser element to be tested is non-defective if (Ib−Ia)/Ib≤0.1 is satisfied.

Moreover, in the testing method according to the present disclosure, it may be determined that the semiconductor laser element to be tested is non-defective in a case in which (i) the laser optical output is a second output when a current value supplied to the semiconductor laser element to be tested in the measuring is a third test current value, (ii) the laser optical output is a third output when a current value supplied to the semiconductor laser element to be tested in the remeasuring is the third test current value, and (iii) the third output is at least 93% of the second output in the determining.

In addition, in the testing method according to the present disclosure, the energizing may include energizing the semiconductor laser element to be tested with a current having a pulse width of at least 0.1 μs and at most 1 μs and a pulse duty ratio of at least 0.1% and at most 50%.

Moreover, in the testing method according to the present disclosure in the energizing, an energization time need not last at most 20 seconds.

In addition, in the testing method according to the present disclosure, an oscillation wavelength of the semiconductor laser element to be tested may be at least 780 nm and at most 860 nm.

Moreover, in the testing method according to the present disclosure, the semiconductor laser element to be tested may include a substrate above which the semiconductor layer is disposed, the substrate containing GaAs. The semiconductor layer may include, sequentially above the substrate, an n-type clad layer containing n-type AlGaInP, an n-side light guiding layer, an active layer including a quantum well structure, a p-side light guiding layer, and a p-type clad layer containing p-type AlGaInP. The quantum well structure may be interposed between the p-side light guiding layer and the n-side light guiding layer, and may include a plurality of well layers and a plurality of barrier layers containing AlGaAs. The n-side light guiding layer and the p-side light guiding layer each may contain $Al_y Ga_z In_{(1-y-z)}P$, y being at least 0 and at most 0.1, z being at least 0 and at most 0.9, y+z being at least 0.3 and at most 0.7.

In addition, in the testing method according to the present disclosure, the plurality of well layers may contain GaAs, InGaAs, or GaAsP Moreover, in order to solve such problems as described above, a testing device according to the present disclosure is a testing device for implementing the testing method. The testing device includes: a test stage whose temperature is controlled and to which the semiconductor laser element to be tested is secured; a test probe that supplies a current to the semiconductor laser element to be tested; and a light receiving element that measures the laser optical output of the semiconductor laser element to be tested.

According to the present disclosure, it is possible to provide a semiconductor laser element etc. which can prevent end-face damage.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments according to the present disclosure will be described with reference to the drawings. The embodiments described below each show a specific example of the present disclosure. The numerical values, shapes, materials, structural elements, the arrangement and connection of the structural elements, steps (processes), order of the steps, etc., in the following embodiments are mere examples, and therefore do not intend to limit the present disclosure. Therefore, among structural elements in the following embodiments, those not recited in any of the independent claims defining the broadest concept are described as optional elements.

Moreover, the drawings are schematic diagrams and do not necessarily provide strictly accurate illustrations Accordingly, scales and the like do not necessarily coincide throughout the drawings. Throughout the drawings, the same sign is given to substantially the same configuration, and redundant description is omitted or simplified.

Embodiment 1

A semiconductor laser element, a testing method, and a testing device according to Embodiment 1 will be described.

[1-1. Semiconductor Laser Element]

First, a semiconductor laser element according to the embodiment will be described with reference to FIG. 1 through FIG. 4.

Figure 1:
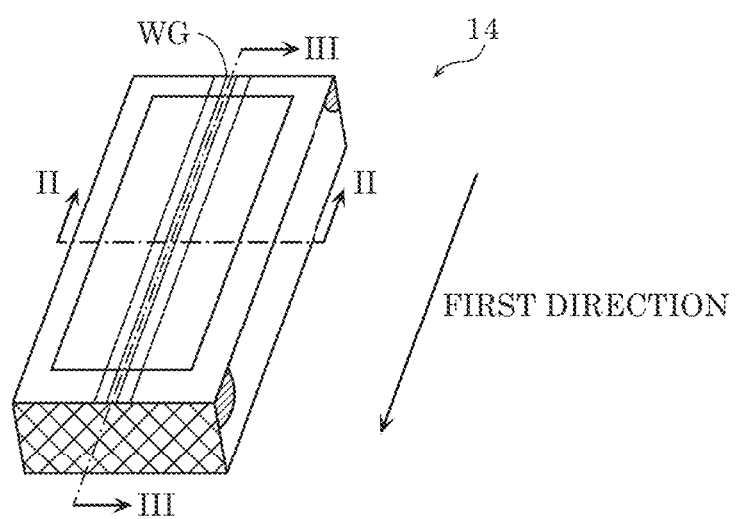
FIG. 1 is a perspective view schematically illustrating an external appearance of a semiconductor laser element according to Embodiment 1.
Figure 2:
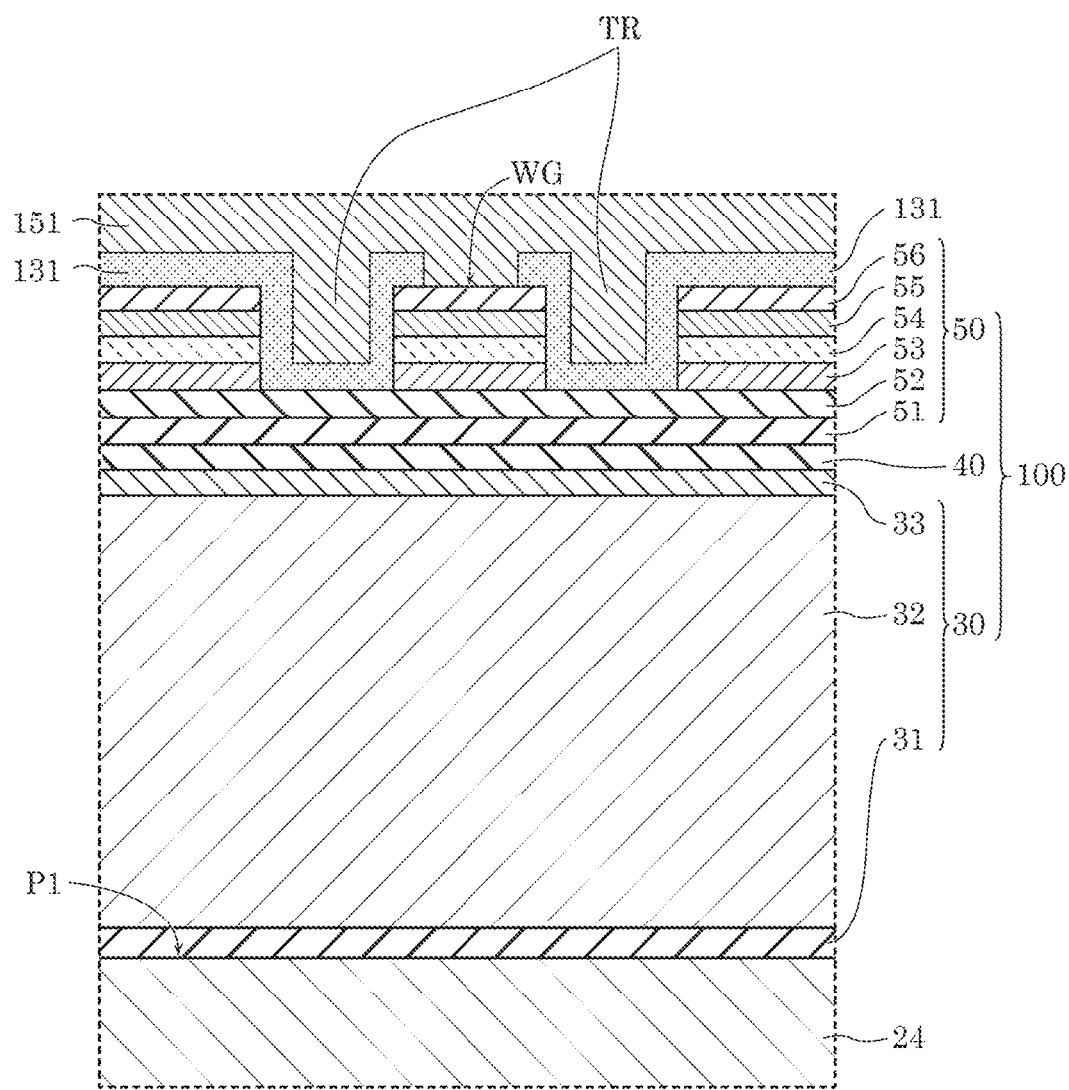
FIG. 2 is a first sectional view schematically illustrating a configuration of the semiconductor laser element according to Embodiment 1.
Figure 3:
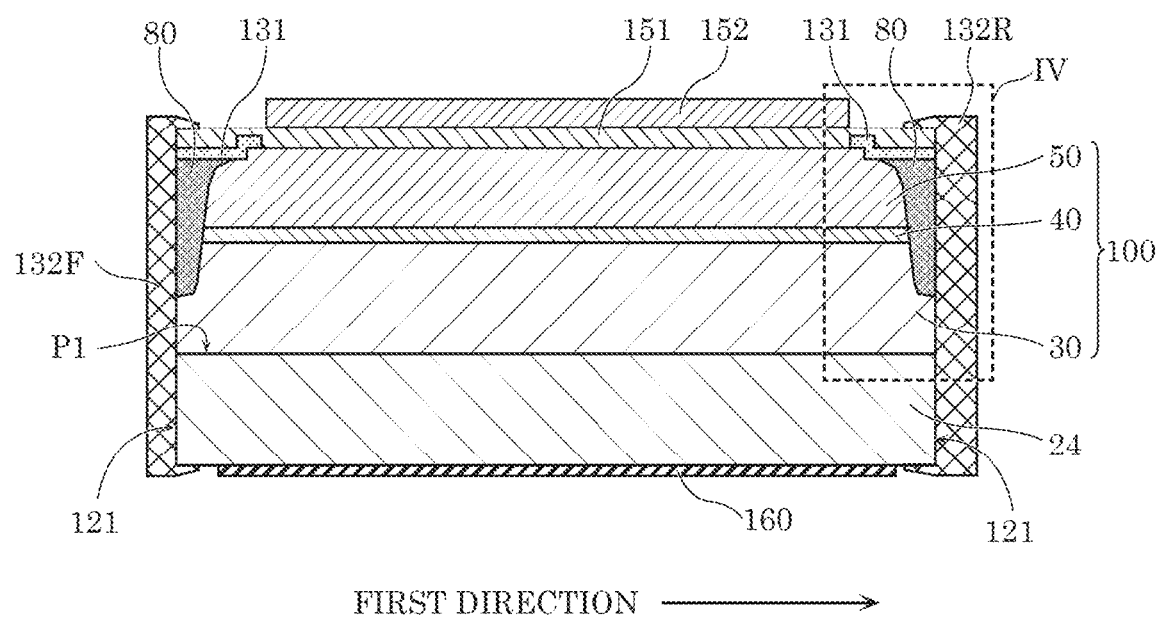
FIG. 3 is a second sectional view schematically illustrating a configuration of the semiconductor laser element according to Embodiment 1.
Figure 4:
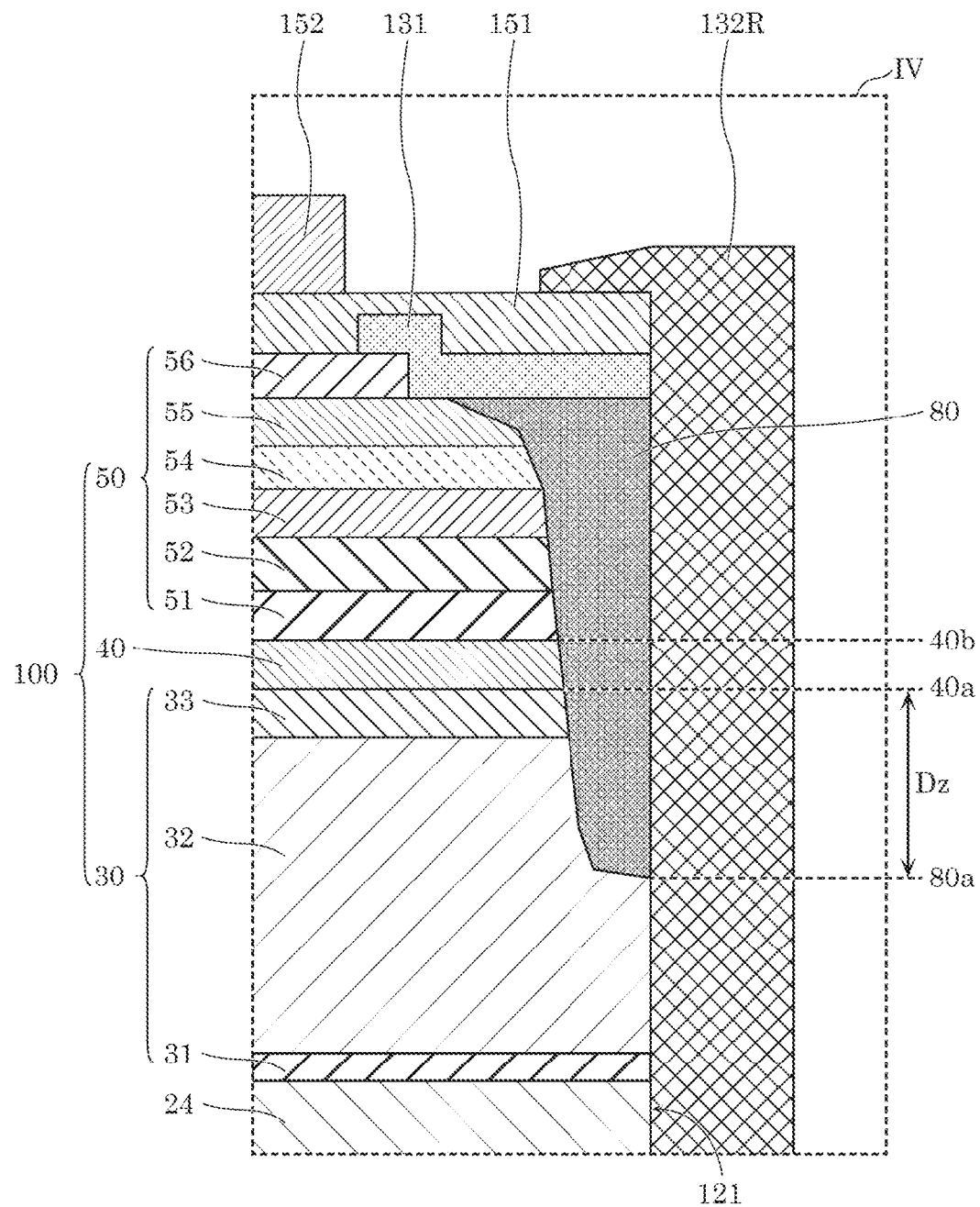
FIG. 4 is partially enlarged view of FIG. 3.

FIG. 1 is a perspective view schematically illustrating an external appearance of semiconductor laser element 14 according to the embodiment. FIG. 2 is a first sectional view schematically illustrating a configuration of semiconductor laser element 14 according to the embodiment. FIG. 2 illustrates an enlarged view of a cross section which is taken along the line II-II shown in FIG. 1 and is in the vicinity of waveguide WG. FIG. 3 is a second sectional view schematically illustrating a configuration of semiconductor laser element 14 according to the embodiment. FIG. 3 illustrates a cross section taken along the line III-III shown in FIG. 1. FIG. 4 is a partially enlarged view of FIG. 3. FIG. 4 is an enlarged view of a portion inside broken-line frame IV shown in FIG. 3.

As illustrated in FIG. 2, semiconductor laser element 14 is an element that includes chip-shaped substrate 24, and semiconductor layer 100 that is disposed above first face P1 of chip-shaped substrate 24 and includes active layer 40. Chip-shaped substrate 24 is a substrate above which semiconductor layer 100 of semiconductor laser element 14 is stacked. In this embodiment, chip-shaped substrate 24 is a substrate containing GaAs. More specifically, chip-shaped substrate 24 is an n-GaAs substrate whose plane orientation is inclined 10 degrees from a (100) plane toward a (011) plane direction. The plane orientation of first face P1 is a (100) plane that inclines 10 degrees toward, or 10 degrees deviated from, the (011) plane direction. Semiconductor layer 100 includes first semiconductor layer 30 including first conductivity type layers, active layer 40, and second semiconductor layer 50 including second conductivity type layers, which are stacked in the stated order from the chip-shaped substrate 24 side.

As illustrated in FIG. 3, semiconductor laser element 14 includes p-side lower electrode 151 and p-side upper electrode 152 which are disposed above semiconductor layer 100, and n-side electrode 160 that is disposed below a face of chip-shaped substrate 24 on which semiconductor layer 100 is not disposed.

In addition, semiconductor layer 100 in semiconductor laser element 14 includes waveguide WG formed in the intra-layer direction of semiconductor layer 100. In other words, waveguide WG is formed along a direction parallel to a principal surface of semiconductor layer 100. In this embodiment, waveguide WG formed using a ridged structure is formed in semiconductor layer 100. Waveguide WG extends in the first direction as illustrated in FIG. 1.

In addition, as illustrated in FIG. 3, the two end faces of semiconductor laser element 14 in the first direction are cleaved end faces 121. Two cleaved end faces 121 function as resonator end faces of semiconductor laser element 14. Second protective films 132F and 132R which function as reflectance control films are formed on the respective cleaved end faces. Second protective films 132F and 132R not only function as reflectance control films disposed on the front side (end face from which laser light is mainly emitted) and the rear side of a resonator, respectively, but also function as protection for cleaved end faces 121.

Moreover, as illustrated in FIG. 3 and FIG. 4, semiconductor layer 100 includes window regions 80 formed in the respective ends of waveguide WG. In this embodiment, window regions 80 in which light absorption is reduced in activation layer 40 are formed in the vicinity of respective two cleaved end faces 121 that function as resonator end faces.

Hereinafter, structural elements of semiconductor laser element 14 will be individually described.

Chip-shaped substrate 24 is a substrate which is segmented into chip shapes and above which semiconductor layer 100 is stacked. The configuration of chip-shaped substrate 24 is not particularly limited. In this embodiment, chip-shaped substrate 24 is an n-GaAs substrate as has been described above.

First semiconductor layer 30 is a semiconductor layer including first conductivity type layers. The configuration of first semiconductor layer 30 is not particularly limited. In this embodiment, as illustrated in FIG. 2, first semiconductor layer 30 includes n-type buffer layer 31, n-type clad layer 32, and n-side light guiding layer 33. N-type buffer layer 31 is an n-GaAs layer having a thickness of 0.4 μm. N-type clad layer 32 is an n-$(Al_{0.16}Ga_{0.84})_{0.5}In_{0.5}P$ layer having a thickness of 4.7 μm. N-side light guiding layer 33 is a $Ga_{0.5}In_{0.5}P$ layer having a thickness of 0.09 μm.

Active layer 40 is a layer that serves as a light emitter of semiconductor laser element 14. The configuration of active layer 40 is not particularly limited. In this embodiment, active layer 40 includes a quantum well structure. The quantum well structure is interposed between p-side light guiding layer 51 and n-side light guiding layer 33, and includes a plurality of well layers and a plurality of barrier layers containing AlGaAs. P-side light guiding layer 51 will be described later. Active layer 40 is a multi-quantum well active layer that includes, from the n-side light guiding layer 33 side, an $Al_{0.59}Ga_{0.41}As$ barrier layer having a thickness of 0.03 μm, a GaAs well layer having a thickness of 0.0065 μm, an $Al_{0.59}Ga_{0.41}As$ barrier layer having a thickness of 0.004 μm, a GaAs well layer having a thickness of 0.0065 μm, and an $Al_{0.59}Ga_{0.41}As$ barrier layer having a thickness of 0.021 μm, for example. It should be noted that active layer 40 may include well layers other than GaAs well layers. Active layer 40 may include InGaAs well layers or GaAsP well layers.

With such active layer 40, the oscillation wavelength of semiconductor laser element 14 is at least 780 nm and at most 860 nm. Such semiconductor laser element 14 emits laser light having energy higher than the energy of laser light emitted by, for example, a semiconductor laser element having an oscillation wavelength in the 1.3 μm band, and thus end-face damage is likely to occur. However, since semiconductor laser element 14 according to the embodiment has distinctive features, such as window regions 80, the resonator length, and the optical guide layers, it is possible to prevent end-face damage. Those distinctive features will be described later.

Second semiconductor layer 50 is a semiconductor layer that includes second conductivity type layers having a conductivity type different from the first conductivity type layers. The configuration of second semiconductor layer 50 is not particularly limited. In this embodiment, as illustrated in FIG. 2, second semiconductor layer 50 includes p-side light guiding layer 51, p-type first clad layer 52, p-type second clad layer 53, p-type third clad layer 54, p-type middle layer 55, and p-type contact layer 56.

P-side light guiding layer 51 is a $Ga_{0.5}In_{0.5}P$ layer having a thickness of 0.07 μm.

P-type first clad layer 52 is a p-$(Al_{0.30}Ga_{0.70})_{0.5}In_{0.5}P$ layer having a thickness of 0.17 μm. P-type second clad layer 53 is a p-$(Al_{0.60}Ga_{0.40})_{0.5}In_{0.5}P$ layer having a thickness of 0.4 μm. P-type third clad layer 54 is a p-$(Al_{0.30}Ga_{0.70})_{0.5}In_{0.5}P$ layer having a thickness of 0.6 μm. It should be noted that each of p-type first clad layer 52, p-type second clad layer 53, and p-type third clad layer 54 is an example of a p-type clad layer according to the embodiment.

P-type middle layer 55 is a p-$(Al_{0.1}Ga_{0.9})_{0.5}In_{0.5}P$ layer having a thickness of 0.106 μm. The Al composition of p-type middle layer 55 is lower than that of p-type third clad layer 54. P-type contact layer 56 is a p-GaAs layer having a thickness of 0.23 μm.

As illustrated in FIG. 2, first protective film 131 is formed on part of the top portion and side faces of a ridge in which waveguide WG is formed, trenches TR, and flat portions on both sides. In the top portion of the ridge, first protective film 131 has a slot from which the top portion of the ridge is exposed. As illustrated in FIG. 4, first protective film 131 covers the vicinity of cleaved end face 121 including window region 80. First protective film 131 is not particularly limited so long as first protective film 131 is a dielectric film. First protective film 131 may contain $SiO_2$, SiN, $TiO_2$, $ZrO_2$, $Al_2O_3$, $Nb_2O_5$, $Ta_2O_5$, etc. First protective film 131 in this embodiment is a SiN film having a thickness of approximately 180 nm.

P-side lower electrode 151 illustrated in FIG. 2 through FIG. 4 is a patterned metal film. In this embodiment, p-side lower electrode 151 includes a Ti film having a thickness of 50 nm, a Pt film having a thickness of 150 nm, and a Au film having a thickness of 50 nm which are stacked in the stated order from the semiconductor layer 100 side. P-side lower electrode 151 comes into contact with p-type contact layer 56 inside the slot in first protective film 131.

P-side upper electrode 152 illustrated in FIG. 3 is a Au film having a thickness of at least 2.0 μm and at most 5.0 μm in this embodiment.

In this embodiment, n-side electrode 160 illustrated in FIG. 3 includes a AuGe film having a thickness of 90 nm, a Ni film having a thickness of 20 nm, a Au film having a thickness of 50 nm, a Ti film having a thickness of 100 nm, a Pt film having a thickness of 50 nm, a Ti film having a thickness of 50 nm, a Pt film having a thickness of 100 nm, and a Au film having a thickness of 500 nm which are stacked in the stated order from the chip-shaped substrate 24 side.

The configuration of second protective films 132F and 132R and the formation method of forming second protective films 132F and 132R are not particularly limited. In this embodiment, second protective film 132F that is used on the front side is a dielectric multilayer in which one or more pairs of an $Al_2O_3$ film having a thickness of 50 nm and a $Ta_2O_5$ film having a thickness of 55 nm are stacked from a cleaved end face 121 side. In addition, second protective film 132R that is used on the rear side is a dielectric multilayer in which a plurality of pairs of a SiO$_2$ film having a thickness of $\lambda/4$ n$_S$ and a Ta$_2$O$_5$ film having a thickness of $\lambda/4$n$_T$ are additionally stacked, after an Al$_2$O$_3$ film having a thickness of $\lambda/8$ n$_A$, a SiO$_2$ film having a thickness of $\lambda/8$ n$_S$, and a Ta$_2$O$_5$ film having a thickness of $\lambda/4$n$_T$ are sequentially stacked from the other cleaved end face 121 side. It should be noted that $\lambda$ denotes the oscillation wavelength of semiconductor laser element 14, and n$_A$, n$_T$, and n$_S$ denote refractive indices of an Al$_2$O$_3$ film, a Ta$_2$O$_5$ film, and a SiO$_2$ film, respectively, with respect to light having wavelength A. In this embodiment, A is approximately 860 nm, and a plurality of pairs of a SiO$_2$ film having a thickness of 147 nm and a Ta$_2$O$_5$ film having a thickness of 102 nm are stacked, after an Al$_2$O$_3$ film having a thickness of 65 nm, a SiO$_2$ film having a thickness of 74 nm, and a Ta$_2$O$_5$ film having a thickness of 102 nm are sequentially stacked from the cleaved end face 121 side.

Window regions 80 are formed by diffusion of a window region formation impurity, such as Zn. Window regions 80 are regions in which an energy band gap in active layer 40 is increased by the diffusion of the window region formation impurity in the vicinity of the resonator end faces of semiconductor laser element 14. Window regions 80 are formed by disordering the quantum well structure of active layer 40. That is, portions of the quantum well structures in the vicinity of the respective resonator end faces are disordered regions In this embodiment, the front side and the rear side of the resonator have different window region lengths (lengths of window regions 80 in the first direction). For example, the window region length of the front side is about 10 μm, and the window region length of the rear side is about 7 μm. As such, the front side having higher optical density has greater window region length. With this, it is possible to reduce end face damage of semiconductor laser element 14.

As illustrated in FIG. 4, window region 80 is formed such that window region 80 ends within n-type clad layer 32. In this embodiment, distance Dz from active layer lower end 40$a$ to Zn diffusion end 80$a$ is 0.8 μm. Active layer lower end 40$a$ is a boundary between n-side light guiding layer 33 and active layer 40. It should be noted that a boundary between active layer 40 and p-side light guiding layer 51 is active layer upper end 40$b$.

The concentration of the window region formation impurity of portions located in window regions 80 within active layer 40 may be, for example, at most $5\times10^{19}$/cm$^3$ or at least $7\times10^{18}$/cm$^3$ and at most $1\times10^{19}$/cm$^3$. In addition, the average concentration of the window region formation impurity of portions of p-type first clad layer 52, p-type second clad layer 53, and p-type third clad layer 54 which are located in window regions 80 is preferably at most six times the average concentration of the window region formation impurity of portions other than the portions in window regions 80, and more preferably, at most three times the average concentration of the window region formation impurity of the portions other than the portions in window regions 80.

As has been described above, semiconductor laser element 14 in this embodiment includes a substrate above which semiconductor layer 100 is stacked and which contains GaAs. In addition, semiconductor layer 100 includes n-type clad layer 32 containing n-type AlGaInP, n-side light guiding layer 33, active layer 40 having the quantum well structure, p-side light guiding layer 51, and p-type clad layers containing p-type AlGaInP, which are sequentially formed above chip-shaped substrate 24. Window regions 80 each include a region in which a portion of the quantum well structure is disordered.

In addition, in this embodiment, saturated optical output power is reduced by shortening the resonator in semiconductor laser element 14, as will be described later. However, this shortening of the resonator may increase an operating voltage of semiconductor laser element 14. In order to decrease the operating voltage, the Al composition of the p-type clad layers (p-type first clad layer 52, p-type second clad layer 5, p-type third clad layer 54) and the n-type clad layer may be reduced. Nevertheless, the reduction in the Al composition of the clad layers reduces a light confinement effect on the clad layers and increases an amount of light leakage toward the p-type clad layer side, thereby increasing optical loss. In addition, the reduction in the Al composition of the clad layers reduces the diffusion rate of Zn, thereby increasing the time required for the formation of window regions 80 having a desired energy band gap. Accordingly, the concentration of Zn diffused in active layer 40 increases, thereby increasing the optical loss in active layer 40.

In view of the above, p-side light guiding layer 51 and n-side light guiding layer 33 each of which contain AlGaInP are interposed between active layer 40 and the p-type clad layers, and between active layer 40 and the n-type clad layer, respectively. With this, the light confinement effect can be obtained, thereby reducing optical loss without increasing the thickness of the barrier layers in active layer 40. It should be noted that the Al composition of the light guiding layers may be lower than that of the clad layers in order that the light guiding layers certainly obtain the light confinement effect. In addition, the use of AlGaInP having a faster Zn diffusion rate than the Zn diffusion rate of AlGaAs for the light guiding layers decreases the concentration of Zn that is diffused in active layer 40, thereby reducing optical loss in window regions 80.

More specifically, p-side light guiding layer 51 and n-side light guiding layer 33 each contain Al$_y$Ga$_z$In$_{(1-y-z)}$P ($0 \leq y \leq 0.1$, $0 \leq z \leq 0.9$, $0.3 \leq y\pm z \leq 0.7$).

As has been described above, the use of p-side light guiding layer 51 and n-side light guiding layer 33 in semiconductor laser element 14 can reduce optical loss in window regions 80.

It should be noted that although the resonator includes a window region on both of the front side and the rear side in this embodiment, a window region may be formed only on the front side and need not be formed on the rear side. In this case, the length of waveguide WG in a region in which window region 80 is not formed is likely to be readily obtained in the case in which the resonator length is shortened, since window region 80 is not formed on the rear side.

Figure 5:
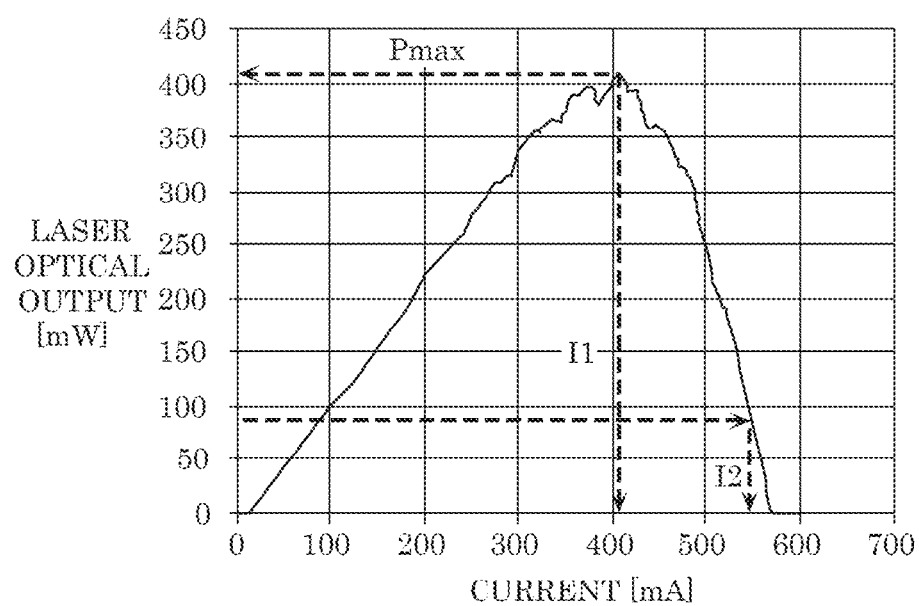
FIG. 5 is a graph showing an example of a current-laser optical output characteristic of the semiconductor laser element according to Embodiment 1.

A current-laser optical output characteristic of semiconductor laser element 14 having a configuration as described above will be described with reference to FIG. 5. FIG. 5 is a graph showing an example of a current-laser optical output characteristic of semiconductor laser element 14 according to the embodiment.

FIG. 5 illustrates a current-laser optical output characteristic displayed in the case in which a current having a pulse width of 0.8 μs and a pulse duty ratio of 24% is supplied to semiconductor laser element 14 that is held on a stage whose stage temperature is controlled at 25° C.±3° C. The horizontal axis of the graph in FIG. 5 represents, in mA, current values supplied to semiconductor laser element 14, and the vertical axis represents, in mW, laser optical outputs of semiconductor laser element 14. When the current value supplied to semiconductor laser element 14 is about 400 mA, maximum value Pmax of a laser optical output of semiconductor laser element 14 is about 400 mW. The laser optical output gradually decreases along with an increase in the current value supplied thereafter, and decreases to about 0 mW when the current value is about 550 mA.

Semiconductor laser element 14 has the current-laser optical output characteristic in which, at the operating temperature of 25° C.±3° C., a laser optical output is at most 20% of maximum value Pmax at second driving current value I2 that is greater than first driving current value I1 at which the laser optical output has maximum value Pmax. With this, it is possible to realize semiconductor laser element 14 that would not be damaged at second driving current value I2.

In addition, by setting the operating temperature of semiconductor laser element 14 at 25° C.±3° C., it is possible to realize semiconductor laser element 14 that would not be damaged due to a large laser flowing current, compared with the case in which semiconductor laser element 14 is energized at high temperatures.

Moreover, the embodiment can realize a semiconductor laser element free of defects and deterioration inside the element. Accordingly, it is possible to realize high-output semiconductor laser element 14 whose maximum value Pmax of a laser optical output is at least 200 mW. It is also possible to realize high-output semiconductor laser element 14 whose maximum value Pmax of a laser optical output is at least 300 mW.

In addition, it is possible to realize a semiconductor laser element whose laser optical output has maximum value Pmax at first driving current value I1, and whose laser optical output is at least 95% of maximum value Pmax at first driving current value I1 when the semiconductor laser element is driven at first driving current value I1 for the second time, after the semiconductor laser element has driven at second driving current value I2.

It is also possible to realize a semiconductor laser element whose laser optical output is at least twice the absolute maximum rated optical output at first driving current value I1 when the semiconductor laser element is driven at first driving current value I1 for the second time. Here, the absolute maximum rated optical output means the maximum optical output allowed under the normal use of semiconductor laser elements.

[1-2. Manufacturing Method of Semiconductor Laser Element]

Next, a manufacturing method of manufacturing the semiconductor laser element according to the embodiment will be described. In this embodiment, each of processes included in the manufacturing method of manufacturing the above-described semiconductor laser element will be described. It should be noted that the above-described semiconductor laser element is an example of a semiconductor laser element.

[1-2-1. Semiconductor Layer Formation Process]

A semiconductor layer formation process according to the embodiment will be described with reference to the drawings. FIG. 5 is a sectional view schematically illustrating substrate 20 that indicates an overview of a process of forming a semiconductor layer in the semiconductor laser element according to the embodiment.

Figure 6:
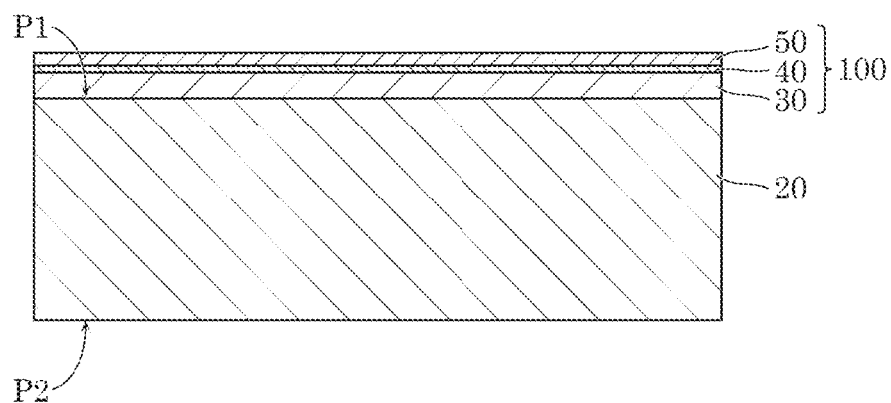
FIG. 6 is a sectional view schematically illustrating a substrate that indicates an overview of a process of forming a semiconductor layer in the semiconductor laser element according to Embodiment 1.

Firstly, substrate 20 having first face P1 and second face P2 is prepared as illustrated in FIG. 6. Semiconductor layer 100 including active layer 40 is then formed above first face P1 of substrate 20. The layers included in semiconductor layer 100 are stacked using, for example, metal organic chemical vapor deposition (MOCVD). As semiconductor layer 100, first semiconductor layer 30 including the first conductivity type layers, active layer 40, and second semiconductor layer 50 including the second conductivity type layers are formed in order from the substrate 20 side in this embodiment.

Figure 7A:
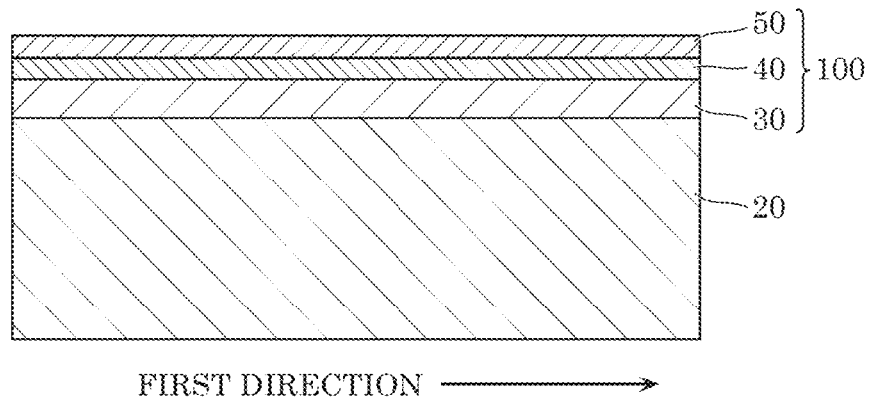
FIG. 7A is a sectional view schematically illustrating the substrate and the semiconductor layer according to Embodiment 1.
Figure 7B:
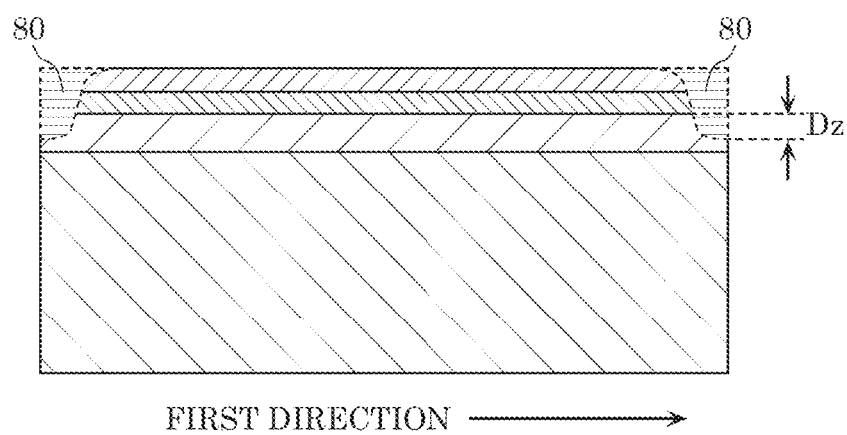
FIG. 7B is a sectional view schematically illustrating the substrate and the semiconductor layer which indicate a first formation method of forming window regions according to Embodiment 1.
Figure 7C:
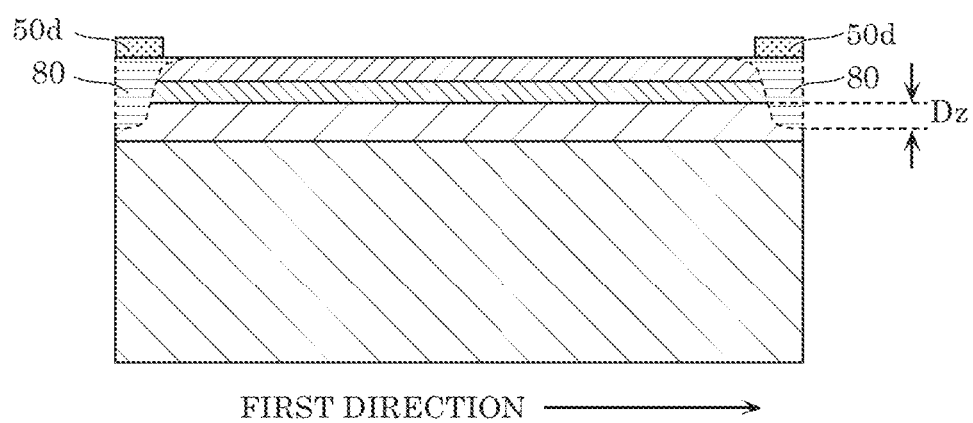
FIG. 7C is a sectional view schematically illustrating the substrate and the semiconductor layer which indicate a second formation method of forming the window regions according to Embodiment 1.

Next, the so-called window regions are formed in regions in the vicinity of respective resonator end faces of the semiconductor laser element in the embodiment. Hereinafter, a window region formation method will be described with reference to FIG. 7A through FIG. 7C. FIG. 7A is a sectional view schematically illustrating substrate 20 and semiconductor layer 100 according to the embodiment. FIG. 7B and FIG. 7C each are a sectional view schematically illustrating substrate 20 and semiconductor layer 100 which indicate the method of forming window regions 80 according to the embodiment. FIG. 7A through FIG. 7C each illustrate a cross section of substrate 20 and semiconductor layer 100 along the first direction.

For example, as illustrated in FIG. 7B, window regions 80 may be formed by thermally diffusing Zn over the p-type contact layer included in second semiconductor layer 50. Specifically, a ZnO film that is used as a diffusion source, and a SiN film and a SiO film which prevent the evaporation of Zn are sequentially formed above the p-type contact layer, and Zn is diffused in the vicinity of the resonator end faces of the semiconductor laser element by means of heat treatment. This increases an energy band gap in active layer 40. Accordingly, window regions 80 in which optical absorption is reduced in active layer 40 are formed. With such a window region formation method, the peak Zn concentration of portions located in window regions 80 within active layer 40 is about at most $5 \times 10^{19}/cm^3$.

In addition, as illustrated in FIG. 7C, window regions 80 may be formed by thermally diffusing Zn via layer 50d containing p-type GaInP or p-type AlGaInP disposed directly above the p-type contact layer. In this case, formed layer 50d is removed after window regions 80 are formed. With such a window region formation method, the peak Zn concentration of the portions located in window regions 80 within active layer 40 is about at most $1 \times 10^{19}/cm^3$.

Figure 8:
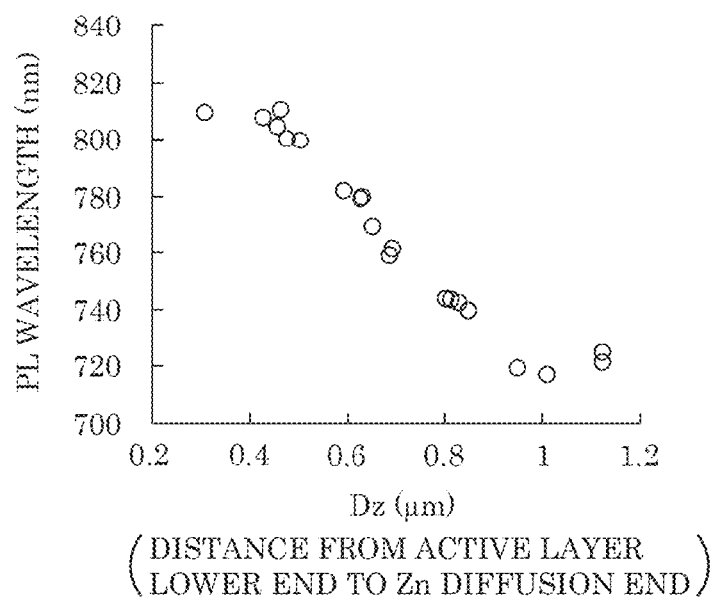
FIG. 8 is a graph showing a relationship between a distance from the active layer to a Zn diffusion end in a window region according to Embodiment 1 and a photoluminescence wavelength from the window region according to Embodiment 1.
Figure 9:
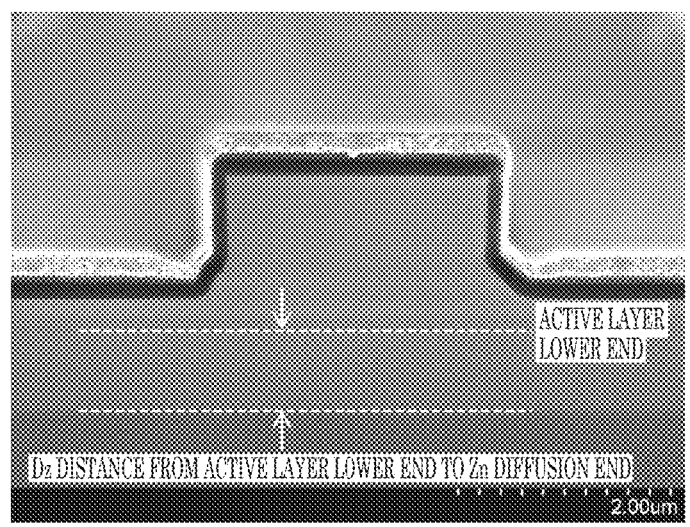
FIG. 9 is a scanning electron micrograph of the window region according to Embodiment 1.
Figure 10:
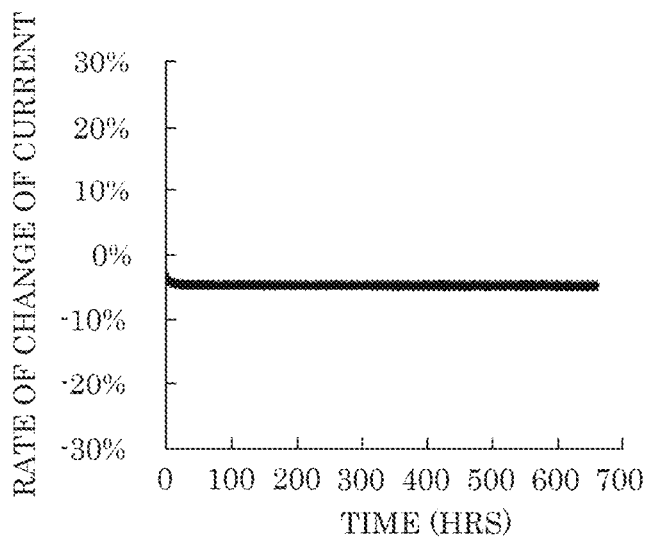
FIG. 10 is a graph showing a result of an acceleration test carried out on the semiconductor laser element in the case in which a distance from an active layer lower end to the Zn diffusion end in the window region according to Embodiment 1 is approximately 0.8 μm.
Figure 11:
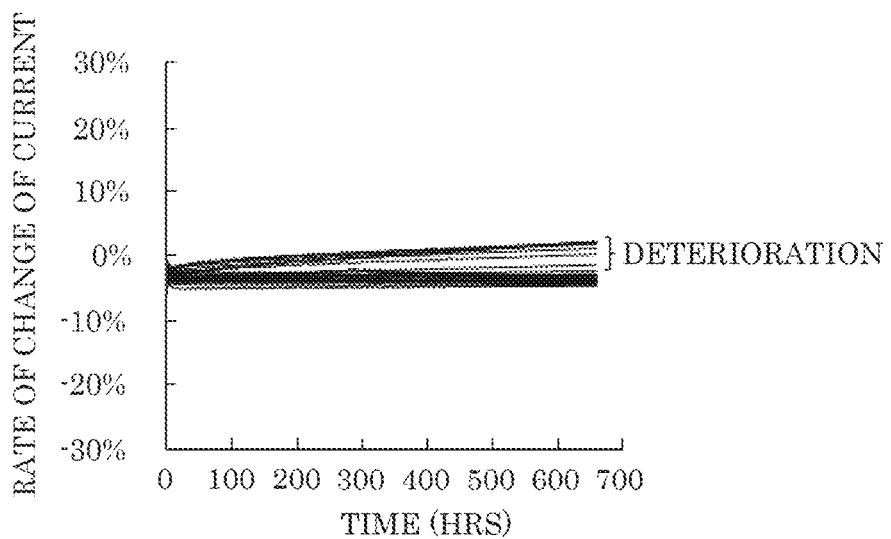
FIG. 11 is a graph showing a result of an acceleration test carried out on the semiconductor laser element in the case in which a distance from the active layer lower end to the Zn diffusion end in the window region according to Embodiment 1 is approximately 0.4 μm.

By forming such window regions 80, it is possible to prevent deterioration to occur in the vicinity of resonator end faces of semiconductor laser element 14. Here, window regions 80 having a more effective configuration will be described with reference to FIG. 8 through FIG. 11. FIG. 8 is a graph showing a relationship between distance Dz from active layer lower end 40a to Zn diffusion end 80a in window region 80 and a photoluminescence (PL) wavelength from window region 80 according to the embodiment. FIG. 9 is a scanning electron micrograph showing window region 80 according to the embodiment. FIG. 10 and FIG. 11 are graphs showing results obtained in acceleration tests carried out on semiconductor laser elements in the case in which a distance from active layer lower end 40a to the Zn diffusion end in window region 80 is approximately 0.8 µm and 0.4 µm, respectively. In the graphs illustrated in FIG. 10 and FIG. 11, the horizontal axis represents acceleration test duration, and the vertical axis represents the rate of change of current that flow into the semiconductor laser elements. The acceleration tests illustrated in FIG. 10 and FIG. 11 were carried out on a plurality of semiconductor laser elements each having a resonator length of 280 µm and under conditions in which the temperature is 110° C. and input power is 70 mW. It should be noted that currents inputted to the semiconductor laser elements are continuous wave (CW) currents.

As illustrated in FIG. 8, a correlation exists between PL wavelengths and distances Dz from active layer lower end 40a to Zn diffusion end 80a. For example, as illustrated in FIG. 9, it should be noted that distance Dz can be measured using a scanning micrograph etc. The whitish region below active layer 40 in FIG. 9 indicates a Zn diffusion region.

As illustrated in FIG. 8, a PL wavelength is longer for a shorter distance Dz. That is, the optical absorption in window region 80 increases, thereby reducing a deterioration preventive effect on a resonator end face which is demonstrated by window region 80. For instance, in the example presented in FIG. 10, the PL wavelength in window region 80 is about 740 nm that is sufficiently short compared to the oscillation wavelength of 830 nm of a semiconductor laser element, and thus the deterioration preventive effect on the resonator end face which is demonstrated by window region 80 is obtained. In contrast, in the example presented in FIG. 11, the PL wavelength in window region 80 is about 805 nm that is not sufficiently short compared to the oscillation wavelength of 830 nm of the semiconductor laser element, and thus changes in the current amount were observed and deterioration occurred in the acceleration tests. That is, in the example presented in FIG. 11, the deterioration preventive effect on a resonator end face which is demonstrated by window region 80 is not obtained.

From such test results, we have found out that the deterioration preventive effect can be sufficiently obtained when the peak wavelength of a spectrum from window region 80 which is obtained by the photoluminescence method is at least 30 nm shorter than the oscillation wavelength of a semiconductor laser element.

It should be noted that although the foregoing has employed the photoluminescence method to obtain the peak wavelength of the spectrum in window region 80, other methods may be employed to obtain the peak wavelength of a spectrum. For example, the cathodoluminescence method may be employed to obtain the peak wavelength of a spectrum.

Moreover, window regions 80 each include a region in which a portion of the quantum well structure is disordered, and the difference between the energy band gap in the disordered region and the energy band gap in a remaining portion of the quantum well structure which is not disordered may be at least 30 meV. We have also found out that the above can sufficiently demonstrate the deterioration preventive effect.

Furthermore, distance Dz from active layer lower end 40a to Zn diffusion end 80a on the chip-shaped substrate 24 side may be at least 0.5 μm. This sufficiently shortens a PL wavelength in window region 80, thereby preventing deterioration of a resonator end face. It should be noted that Zn diffusion end 80a is a diffusion end of Zn that is the window region formation impurity in window region 80.

[1-2-2. Waveguide Formation Process]

Figure 12:
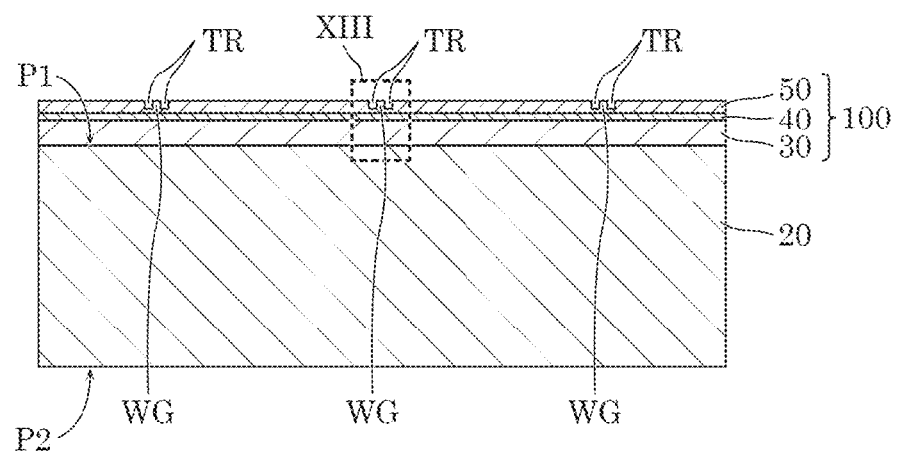
FIG. 12 is a sectional view schematically illustrating the substrate that indicates an overview of a waveguide formation process according to Embodiment 1.

Next, a waveguide formation process will be described with reference to the drawing. FIG. 12 is a sectional view schematically illustrating substrate 20 that indicates an overview of a waveguide formation process according to the embodiment.

As illustrated in FIG. 12, pairs of trenches TR are formed in second semiconductor layer 50 that is formed above substrate 20 in the direction perpendicular to a printout of FIG. 12. Ridges formed between the pairs of trenches TR are used to form waveguides WG. In this way, a plurality of waveguides WG that extend in the first direction are formed in semiconductor layer 100. Waveguides WG each have a width of about 3 μm, for example.

The method of forming waveguides WG is not particularly limited. In this embodiment, a mask is made from $SiO_2$ etc. using a photolithographic technique to form the ridges. Next, trenches TR, namely, the ridges are formed by non-selective etching such as dry etching. At this time, dry etching is performed on the p-type contact layer, the p-type middle layer, the p-type third clad layer, and the p-type second clad layer. The p-type second clad layer is removed partway without being completely removed.

Next, a protective film, such as a $SiO_2$ film, is formed on the entire upper face of semiconductor layer 100 in which the ridges are formed.

Next, the $SiO_2$ protective film is removed only from the bottom portions of trenches TR by dry etching. At this time, the side walls and top portions of the ridges are covered with the protective film.

Next, the p-type second clad layer is completely removed by selective etching such as wet etching. Accordingly, the p-type first clad layer is exposed in the bottom portions of trenches TR. In this way, as described above, waveguides WG can be formed in semiconductor layer 100.

A dry etching technique that can be applied in this embodiment may be anisotropic plasma etching. The dry etching technique includes, for example, a method that uses inductively coupled plasma (hereinafter, ICP) or electron cyclotron resonance (hereinafter, ECR) plasma.

In addition, a mixed gas of, for example, $SiCl_4$ and Ar is used as an etching gas, but a chlorine gas, a boron trichloride gas, etc. may be used instead of $SiCl_4$.

In this embodiment, the ICP method is employed as a dry etching technique, and the mixed gas of $SiCl_4$ and Ar is used as an etching gas. Conditions for etching are as follows: the volume content of $SiCl_4$ in the mixed gas is 5% to 12%; the temperature of a lower electrode above which the semiconductor substrate is disposed is 150° C. to 200° C.; the pressure inside a chamber is 0.1 Pa to 1 Pa; bias power of the lower electrode is 50 W to 150 W; and the ICP power is 200 W to 300 W. The conditions for etching are not, however, limited to the above, and may be suitably selected.

[1-2-3. First Protective Film Formation Process]

Next, a first protective film formation process will be described with reference to FIG. 13.

Figure 13:
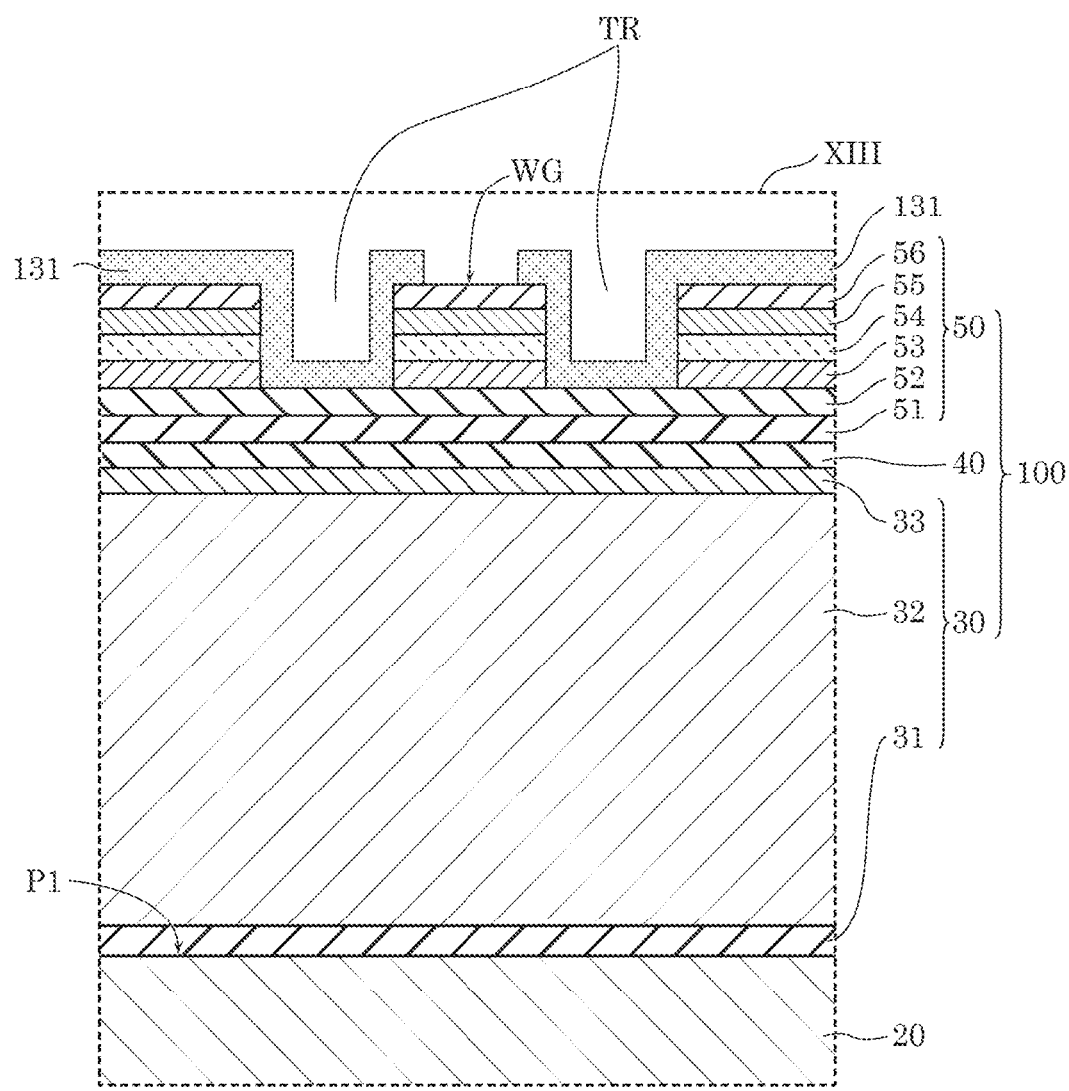
FIG. 13 is a sectional view schematically illustrating the substrate that indicates an overview of a first protective film formation process according to Embodiment 1.

FIG. 13 is a sectional view schematically illustrating substrate 20 that indicates an overview of a first protective film formation process according to the embodiment. FIG. 13 is an enlarged view of an inside of the broken-line frame XIII shown in FIG. 12 which illustrates the first protective film formation process. As illustrated in FIG. 13, first protective film 131 is formed above semiconductor layer 100, except for part of the top portion of a ridge. The part of the top portion of the ridge above which first protective film 131 is not formed is a region that is connected with the p-side lower electrode which will be formed later.

The method of forming first protective film 131 is not particularly limited. In this embodiment, approximately 180 nm of first protective film 131 made of SiN is formed on part of the top portion and side faces of a ridge, trenches TR, and flat portions on both sides.

[1-2-4. Electrode Formation Process]

Next, an electrode formation process will be described. Electrodes formed in this process are p-side electrodes, an n-side electrode, etc. for supplying electric power to a semiconductor laser element that is manufactured by employing the manufacturing method according to the embodiment.

P-side lower electrode 151 is formed above semiconductor layer 100 including the top portions of the ridges and trenches TR. In addition, p-side upper electrode 152 is formed above p-side lower electrode 151. P-side lower electrode 151 is connected with second semiconductor layer 50 via slots in first protective film 131 provided in the ridges.

The configuration of p-side lower electrode 151 and p-side upper electrode 152 and the method of forming p-side lower electrode 151 and p-side upper electrode 152 are not particularly limited. In this embodiment, semiconductor layer 100 is masked with resist using photolithography, and after wet etching of semiconductor layer 100 completes as a pretreatment, a Ti film having a thickness of 50 nm, a Pt film having a thickness of 150 nm, and a Au film having a thickness of 50 nm are sequentially formed by a vapor deposition method.

Next, a pattern for p-side upper electrode 152 is formed with a resist mask using photolithography, and a Au film having a thickness of at least 2.0 μm and at most 5.0 μm is formed by an electroplating method. Next, patterned p-side upper electrode 152 is formed by removing the resist using a lift-off method.

Next, substrate 20 is ground until the thickness from second face P2 of substrate 20 to p-side upper electrode 152 is approximately 100 μm (the grinding process is not illustrated). Next, a resist mask is formed on second face P2 using photolithography, and after wet etching of semiconductor layer 100 completes as a pretreatment, a AuGe film, a Ni film, a Au film, a Ti film, a Pt film, a Ti film, a Pt film, and a Au film are sequentially formed by a vapor deposition method. Next, patterned n-side electrode 160 is formed by removing the resist using the lift-off method.

Through these processes, substrate 20 above which semiconductor layer 100 is stacked is formed.

[1-2-5. Cleavage Process]

Next, a cleavage process will be described with reference to the drawings. In this process, substrate 20 above which semiconductor layer 100 is stacked and which is formed through the processes described above is cleaved in faces corresponding to the resonator end faces of semiconductor laser element 14. That is, as illustrated in FIG. 3, substrate 20 is cleaved such that window regions 80 are placed in the respective resonator end faces. In this embodiment, substrate 20 is cleaved such that the resonator length of semiconductor laser element 14 is at most 300 μm. With this, a bar-shaped substrate on which semiconductor layer 100 is disposed can be formed.

By making the resonator length of semiconductor laser element 14 at most 300 μm, the proportion of regions of waveguides WG other than the regions of waveguides WG in window regions 80 can be decreased. Accordingly, it is possible to reduce saturated optical output power. Therefore, end-face damage of semiconductor laser element 14 can be prevented. In this embodiment, the resonator length is 280 μm.

[1-2-6. Second Protective Film Formation Process]

Next, a second protective film formation process will be described. In this process, using ECR chemical vapor deposition, the second protective layers are formed on cleaved end faces 121 which are formed through the cleavage process described above. It should be noted that the configuration and method of forming second protective layers 132F and 132R are not particularly limited.

The light reflectance of second protective layer 132F on the front side is about 30%, and the light reflectance of second protective layer 132R on the rear side is at least 90%. Furthermore, semiconductor laser element 14 according to the embodiment can be formed by dividing the bar-shaped substrate formed through the above-described process into chip shapes.

[1-3. Testing Method of Semiconductor Laser Element]

Next, a testing method for testing semiconductor laser element 14 according to the embodiment will be described.

[1-3-1. Testing Device]

Figure 14:
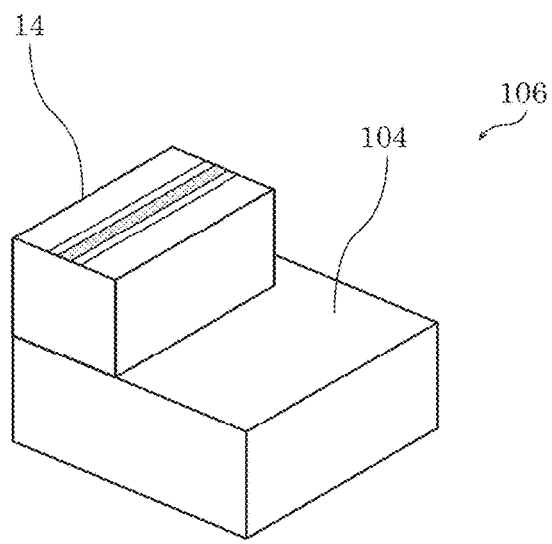
FIG. 14 is a perspective view illustrating a configuration of a semiconductor laser device according to Embodiment 1.

First, the state of semiconductor laser element 14 in a test will be described with reference to FIG. 14. FIG. 14 is a perspective view illustrating a configuration of semiconductor laser device 106 according to the embodiment. As illustrated in FIG. 14, semiconductor laser device 106 includes semiconductor laser element 14 and submount 104. In semiconductor laser device 106, semiconductor laser element 14 is placed on submount 104. As such, semiconductor laser element 14 is tested as semiconductor laser device 106 in a state of being placed on submount 104.

So long as submount 104 is made of a material having good heat dissipation, the material is not particularly limited. Si, SiC, AlN, CuW, etc. can be used for submount 104. In this embodiment, submount 104 is made of Si. Semiconductor laser element 14 is placed onto submount 104 with a AuSn solder in a junction-up manner, for example.

Figure 15:
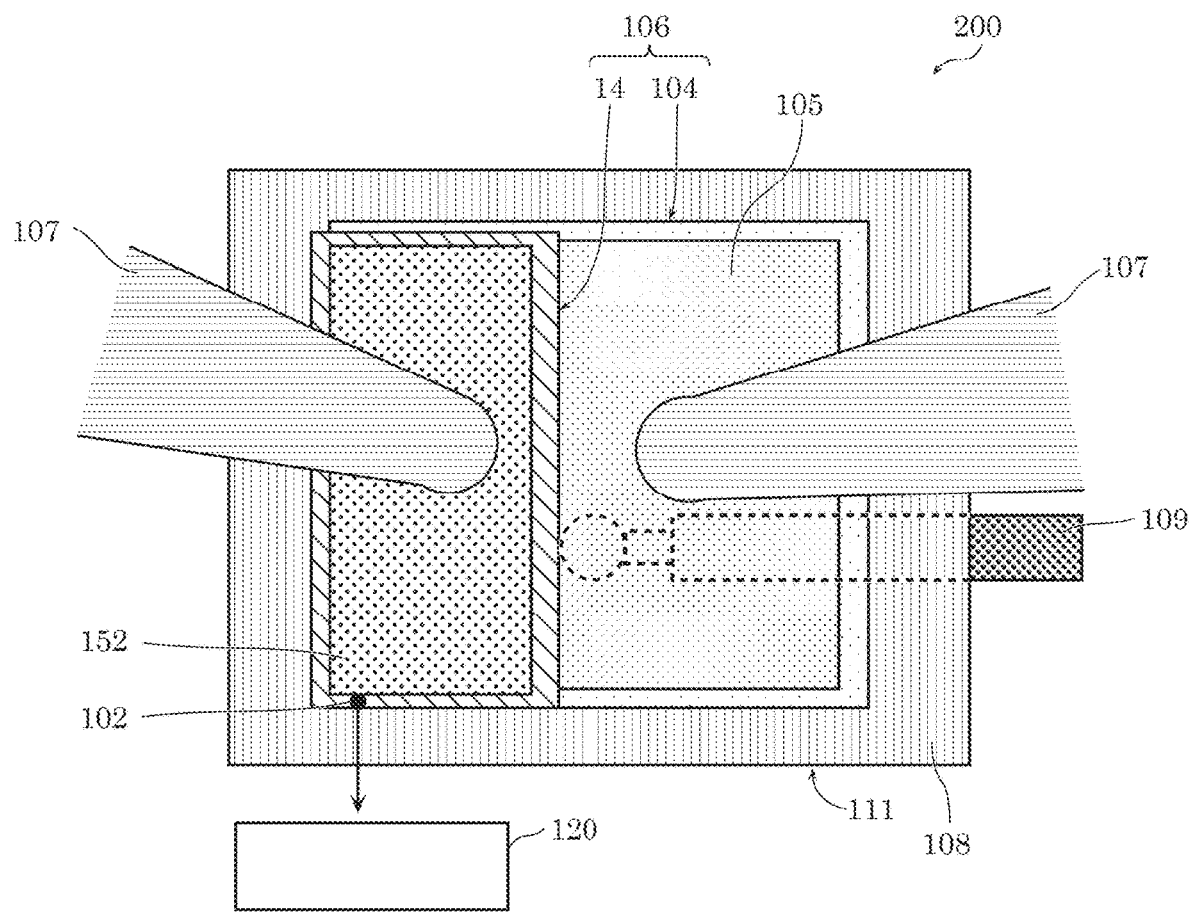
FIG. 15 is a top view schematically illustrating a configuration of a testing device according to Embodiment 1.
Figure 16:
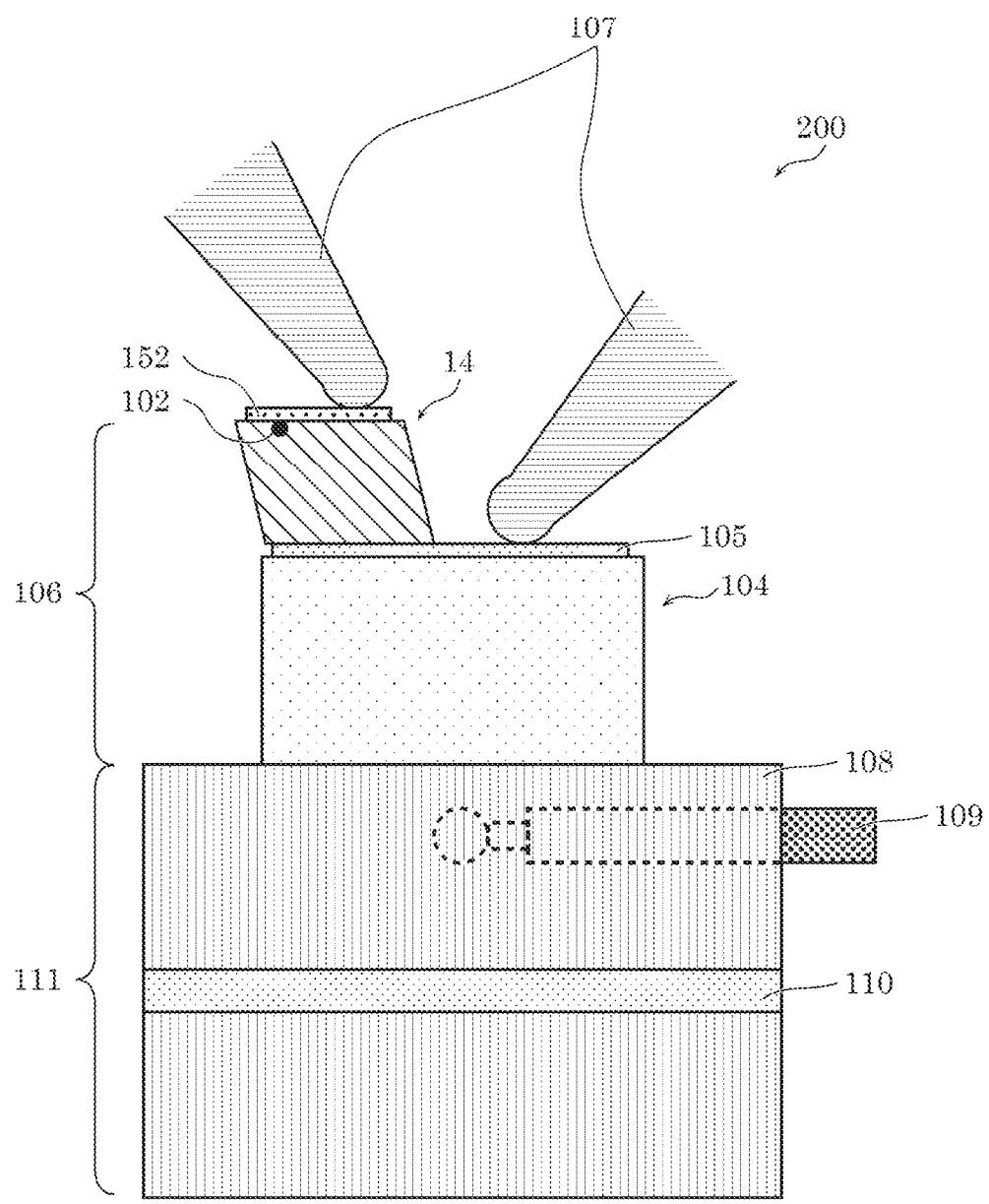
FIG. 16 is a front view schematically illustrating the configuration of the testing device according to Embodiment 1.

Next, a testing device used in the testing method of testing semiconductor laser element 14 according to the embodiment will be described with reference to FIG. 15 and FIG. 16. FIG. 15 and FIG. 16 are the top view and the front view which schematically illustrate a configuration of testing device 200 according to the embodiment, respectively. It should be noted that FIG. 15 and FIG. 16 illustrate, along with testing device 200, semiconductor laser device 106 that includes semiconductor laser element 14. Semiconductor laser element 14 is an example of a semiconductor laser element to be tested to which the testing method according to the embodiment is applied. In addition, light receiving element 120 included in testing device 200 is not illustrated in FIG. 16.

As illustrated in FIG. 15 and FIG. 16, testing device 200 according to the embodiment includes test stage 111, test probe 107 that supplies currents to the semiconductor laser element to be tested, and light receiving element 120.

Testing device 200 according to the embodiment may use, as a semiconductor laser element to be tested, semiconductor laser element 14 alone or semiconductor laser element 14 in a state of being placed on submount 104, for example. Hereinafter, an example in which semiconductor laser element 14 in a state of being placed on submount 104 (i.e., semiconductor laser device 106) is used as a semiconductor laser element to be tested will be described.

Test stage 111 is a stage whose temperature is controlled and to which a semiconductor laser element to be tested is secured. As illustrated in FIG. 16, test stage 111 includes metal stage 108, temperature measurement element 109, and temperature control element 110.

Metal stage 108 is a stage made of a material having high thermal conductivity. For example, metal stage 108 may be made of Cu etc. In addition, metal stage 108 has a function of securing the semiconductor laser element to be tested. The configuration of securing the semiconductor laser element to be tested is not particularly limited. For example, metal stage 108 may have a through hole in the surface on which the semiconductor laser element to be tested is placed, and air may be evacuated from the through hole such that the semiconductor laser element to be tested adheres to metal stage 108.

Temperature measurement element 109 is an element that measures the temperature of test stage 111. The configuration of temperature measurement element 109 is not particularly limited. In this embodiment, temperature measurement element 109 includes a resistance thermometer bulb using Pt etc. With this, the temperature of test stage 111 can be accurately measured. In addition, temperature measurement element 109 is inserted in a hole formed in metal stage 108 in the embodiment.

Temperature control element 110 is an element that controls the temperature of test stage 111. Temperature control element 110 is feedback controlled such that results of temperature measured by temperature measurement element 109 are maintained within a predetermined range. The configuration of temperature control element 110 is not particularly limited. In this embodiment, a Peltier device is used as temperature control element 110. With this, test stage 111 can be promptly cooled and heated, and thus the temperature can be accurately controlled. In this embodiment, the temperature of test stage 111 can be maintained at 25° C.±1° C. (i.e., in the range of at least 24° C. and at most 26° C.).

Test probe 107 supplies currents to the semiconductor laser element to be tested. Test probe 107 consists of two probes including a high-potential probe and a low-potential probe, and currents are supplied from an electric power source connected to test probe 107. The amount of current that flows into test probe 107 can be adjusted by controlling the electric power source. In this embodiment, the high-potential probe is in contact with p-side upper electrode 152 of semiconductor laser element 14 that is the semiconductor laser element to be tested. The low-potential probe is in contact with electrode 105 above submount 104. Electrode 105 of submount 104 is connected with n-side electrode 160 of semiconductor laser element 14. Such test probe 107 can supply desired currents to the semiconductor laser element to be tested.

Light receiving element 120 illustrated in FIG. 15 is an element that measures a laser optical output of the semiconductor laser element to be tested. Light receiving element 120 is located opposite light emitter 102 that corresponds to a laser light emitter of semiconductor laser element 14, which is the semiconductor laser element to be tested, and measures a laser optical output of semiconductor laser element 14. The configuration of light receiving element 120 is not particularly limited. For example, a thermal sensor, a photodiode, etc. can be used as light receiving element 120.

The testing device according to the embodiment having such a configuration as described above can measure the relationship between a supplied current and a laser optical output while accurately controlling the temperature of test stage 111, namely, the temperature of the semiconductor laser element to be tested. With this, it is possible to accurately determine whether the semiconductor laser element to be tested is defective.

[1-3-2. Testing Process]

Figure 17:
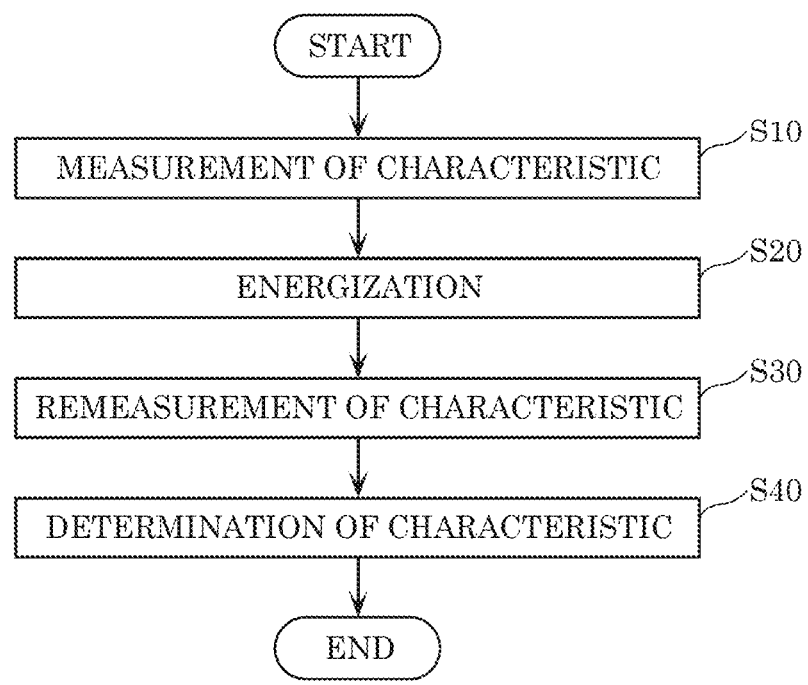
FIG. 17 is a flowchart illustrating a testing method of testing the semiconductor laser element according to Embodiment 1.

Next, each of processes in a testing method of testing semiconductor laser element 14 according to the embodiment will be described with reference to FIG. 17. FIG. 17 is a flowchart illustrating a testing method of testing semiconductor laser element 14 according to the embodiment.

Firstly, a characteristic of a semiconductor laser element to be tested is measured as indicated in FIG. 17 (S10). Specifically, first test current value Ia that is supplied to the semiconductor laser element to be tested when a laser optical output is first output Pw1 is measured. Here, first output Pw1 is not particularly limited so long as it is a laser optical output that the semiconductor laser element to be tested can output. For example, first output Pw1 may be a rated laser optical output. In this embodiment, first output Pw1 is 50 mW. A current that flows into test probe 107 is measured when a laser optical output is 50 mW while the laser optical output of the semiconductor laser element to be tested is measured using light receiving element 120 included in testing device 200 according to the embodiment.

Figure 18:
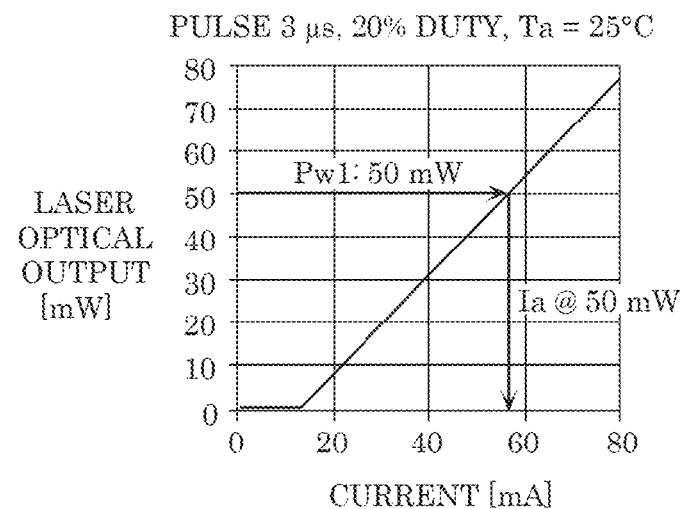
FIG. 18 is a graph showing an example of a result obtained by measuring first test current value Ia in step S10 according to Embodiment 1.

Here, an example of a measurement result obtained in this testing process will be described with reference to FIG. 18. FIG. 18 is a graph showing an example of a result obtained by measuring first test current value Ia in step S10 according to the embodiment. The horizontal axis of the graph in FIG. 18 represents, in mA, current values supplied to the semiconductor laser element to be tested, and the vertical axis represents, in mW, laser optical outputs of the semiconductor laser element to be tested. In addition, in the example presented in FIG. 18, a current having a pulse width of 3 µs and a pulse duty ratio of 20% is supplied to the semiconductor laser element to be tested. That is, the current is intermittently supplied. The operating temperature of the semiconductor laser element to be tested is in the range of 25° C.±1° C. That is, the temperature of test stage 111 of testing device 200 is controlled in the range of 25° C.±1° C. In the example presented in FIG. 18, first test current value Ia is approximately 56 mA.

In addition, in this process, second driving current value I2 is measured. Second driving current value I2 is a value which is greater than first driving current value I1 at which a laser optical output of the semiconductor laser element to be tested has maximum value Pmax, and at which the laser optical output is at most 20% of maximum value Pmax. The operating temperature of the semiconductor laser element to be tested for the measurement of second driving current value I2 is in the range of 25° C.±3° C. In this embodiment, the operating temperature of the semiconductor laser element to be tested for the measurement of second driving current value I2 is in the range of 25° C.±1° C.

Here, an example of a result obtained by measuring second driving current value I2 will be described with reference to FIG. 5 described above. FIG. 5 is also a graph showing an example of a result obtained by measuring second driving current value I2 in step S10 according to the embodiment. The horizontal axis of the graph in FIG. 5 represents, in mA, current values supplied to a semiconductor laser element to be tested, and the vertical axis represents, in mW, laser optical outputs of the semiconductor laser element to be tested.

In the example presented in FIG. 5, a current having a pulse width of 0.8 µs and a pulse duty ratio of 24% is supplied to the semiconductor laser element to be tested. Since maximum value Pmax is about 400 mW and first driving current value I1 is about 400 mA in the example presented in FIG. 5, second driving current value I2 can be estimated to be at least 550 mA at which a laser optical output is about at most 80 mW. In addition, in this embodiment, a characteristic specific to each of semiconductor elements to be tested is obtained for each semiconductor element to be tested. Second driving current value I2 is determined, for each semiconductor laser element to be tested, based on a characteristic specific to each semiconductor element to be tested which is obtained in this process. Accordingly, second driving current values I2 each specific to a semiconductor element to be tested may have different values. With this, it is possible to supply each semiconductor laser element to be tested with a current having a current value suitable for the semiconductor laser element to be tested.

Figure 19:
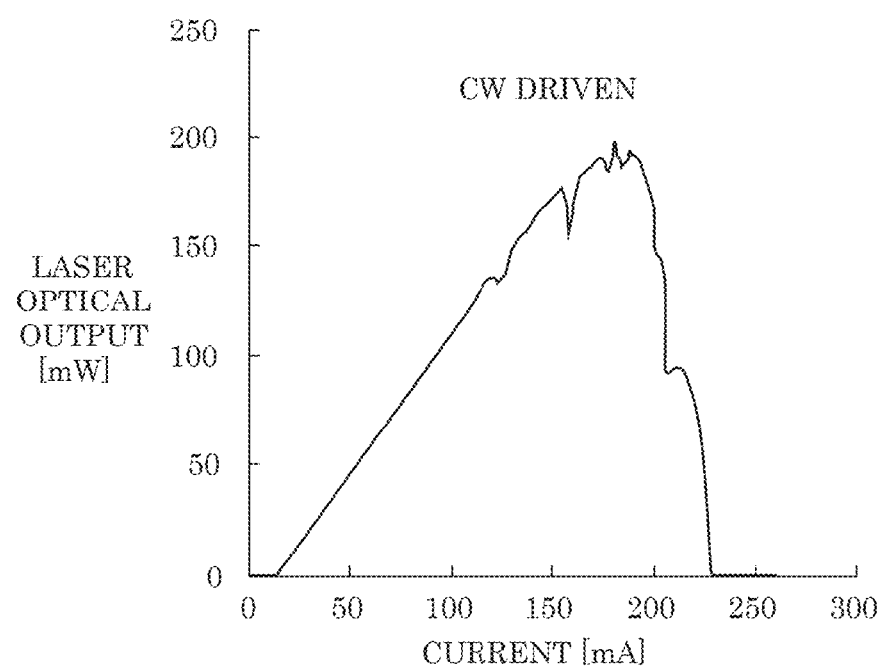
FIG. 19 is a graph showing a current-laser optical output characteristic in the case in which a continuous wave (CW) current is supplied to a semiconductor laser element to be tested according to Embodiment 1.

An effect produced by the use of such a pulsed current will be described with reference to FIG. 5 and FIG. 19. FIG. 19 is a graph showing a current-laser optical output characteristic in the case in which a continuous wave (CW) current is supplied to a semiconductor laser element to be tested according to the embodiment. The graph illustrated in FIG. 5 which shows a case in which a pulsed current is supplied to a semiconductor laser element to be tested is compared with the graph illustrated in FIG. 19 which shows a case in which a CW current is supplied to the semiconductor laser element to be tested. As shown in FIG. 5 and FIG. 19, the laser optical output is low and the current value supplied is small in the case in which a CW current is supplied. It can be estimated that the amount of heat produced in the semiconductor laser element to be tested has increased in the case in which a CW current is supplied, and that the semiconductor laser element to be tested is affected by the heat produced. As such, since a greater value can be determined to be second driving current value I2 in the case in which a pulsed current is supplied to the semiconductor laser element to be tested, the semiconductor laser element to be tested can be tested with a higher laser optical output and a greater current value.

It should be noted that if second driving current value I2 is measured at higher temperatures in the process of measuring second driving current value I2 in the temperature range of 25° C.±3° C. in step S10, a laser optical output will be low, and a current value to be supplied will be small, and thus second driving current value I2 is determined to be small. As such, since a greater value can be determined to be second driving current value I2 in the case in which a pulsed current is supplied to the semiconductor laser element to be tested in the temperature range of 25° C.±3° C., the semiconductor laser element to be tested can be tested with a higher laser optical output and a greater current value.

It should be noted that although second driving current value I2 is measured for each semiconductor laser element to be tested in the testing process, second driving current value I2 need not be measured in the testing process. For example, second driving current value I2 may be predetermined prior to the testing process by measuring second driving current value I2 using a standard sample of a semiconductor laser element to be tested.

Moreover, in addition to the condition in which a laser optical output is at most 20% of maximum value Pmax, a current value at which a laser optical output of a semiconductor laser element to be tested is at most 100 mW may be determined to be second driving current value I2. This can further increase second driving current value I2, and thus it is possible to select a semiconductor laser element that is more resistant to damage. Furthermore, in addition to the aforementioned conditions a current value at which a laser optical output of a semiconductor laser element to be tested is at most 50 mW or a current value at which laser oscillation stops may be determined to be second driving current value I2. With this, it is possible to select a semiconductor laser element that is even more resistant to damage.

As illustrated in FIG. 17, after the above-described step S10 is performed, the semiconductor laser element to be tested is energized at the above-described second driving current value I2 (S20). In this process, the operating temperature of the semiconductor laser element to be tested is set in the range of 25° C.±3° C. In this embodiment, the semiconductor laser element to be tested is energized with a current having a pulse width of at least 0.1 μs and at most 1 μs and a pulse duty ratio of at least 0.1% and at most 50%. Here, since second driving current value I2 is determined by supplying a pulsed current in the temperature range of 25° C.±3° C. in step S10, a laser flowing current to be flowed into the semiconductor laser element to be tested in step S20 can be increased, thereby reducing time required for the test.

In this embodiment, a current having a pulse width of 0.8 μs and a pulse duty ratio of 24% is supplied, for 8 seconds as an energization time, to the semiconductor laser element to be tested whose operating temperature is set in the range of 25° C.±1° C. It should be noted that the energization time may be at most 20 seconds, for example. Here, the energization time includes not only a period during which a pulsed current actually flows into the semiconductor laser element to be tested, but also a current supply disruption period (i.e., a period during which a current does not flow into the semiconductor laser element to be tested) between pulses. It should be noted that the energization process may be performed at higher operating temperatures. For example, the energization process may be performed at the operating temperature of about 100° C. This increases the junction temperature of the semiconductor laser element to be tested during the time in which the semiconductor laser element to be tested is energized and applies a high load to the semiconductor laser element to be tested, thereby reducing the energization time. Furthermore, the energization time may be at least 5 seconds and at most 20 seconds. The energization time of at least 5 seconds makes it possible to select a semiconductor laser element that is more resistant to damage.

After the above-described step S20 is performed, a characteristic of the semiconductor laser element to be tested is measured again in the same manner as in the above-described step S10 (S30). Here, second test current value Ib is measured. Second test current value Ib is a current value supplied to the semiconductor laser element to be tested when the laser optical output is the above-described first output Pw1.

Next, the characteristic of the semiconductor laser element to be tested obtained in step S10 is compared with the characteristic of the semiconductor laser element to be tested obtained in step S30 to determine whether the semiconductor laser element to be tested is defective (S40).

Figure 20:
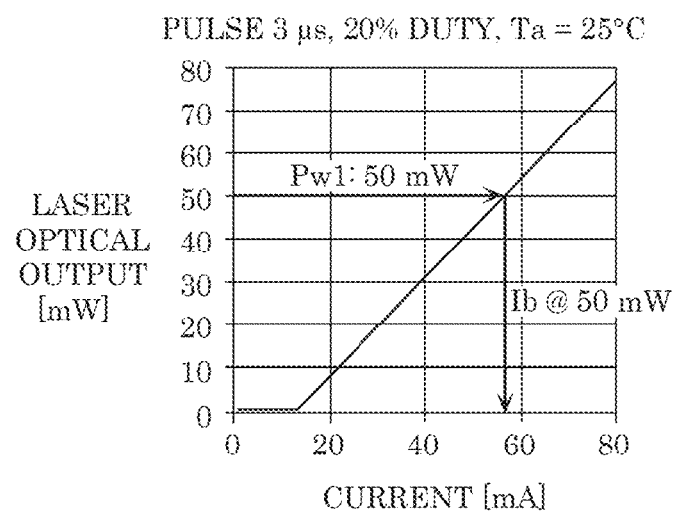
FIG. 20 is a graph showing an example of a first result obtained by measuring second test current value Ib in step S30 according to Embodiment 1.
Figure 21:
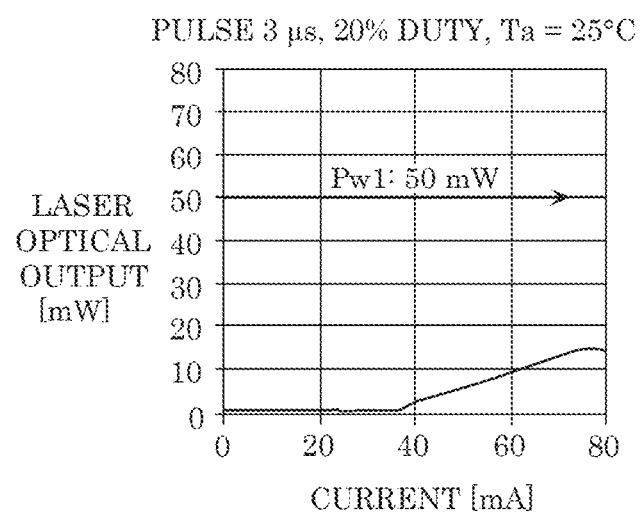
FIG. 21 is a graph showing an example of a second result obtained by measuring second test current value Ib in step S30 according to Embodiment 1.

Here, an example of determination which is presented in the process will be described with reference to FIG. 20 and FIG. 21. FIG. 20 and FIG. 21 are graphs showing examples of results obtained by measuring second test current value Ib in step S30 according to the embodiment. The horizontal axes in FIG. 20 and FIG. 21 each represent, in mA, current values supplied to the semiconductor laser element to be tested, and the vertical axes in FIG. 20 and FIG. 21 each represent, in mW, laser optical outputs of the semiconductor laser element to be tested. In addition, in the examples illustrated in FIG. 20 and FIG. 21, a current having a pulse width of 3 μs and a pulse duty ratio of 20% is supplied to the semiconductor laser element to be tested in the same manner as the example presented in FIG. 18. The operating temperature of the semiconductor laser element to be tested is in the range of 25° C.±1° C.

Like first test current value Ia, second test current value Ib that is supplied to the semiconductor laser element to be tested when the laser optical output is first output Pw1 (50 mW) is approximately 56 mA in the example presented in FIG. 20. As such, it is determined that a semiconductor laser element to be tested that shows no change in the characteristic even after the semiconductor laser element is energized in step S20 is non-defective.

In contrast, second test current value Ib in the example presented in FIG. 21 is greater than 80 mA. That is, it is estimated that the energization performed in step S20 has caused damage to the semiconductor laser element to be tested, thereby causing a change in the characteristic of the semiconductor laser element to be tested. As such, it is determined that a semiconductor laser element to be tested that shows a change in the characteristic after the semiconductor laser element is energized in step S20 is defective.

In this embodiment, if the relation (Ib−Ia)/Ib≤0.1 is satisfied between first test current value Ia and second test current value Ib, it is determined that a semiconductor laser element to be tested is non-defective. Otherwise, it is determined that the semiconductor laser element to be tested is defective.

The above-described testing method makes it possible to select a semiconductor laser element having the current-laser optical output characteristic in which, at the operating temperature of 25° C.±3° C., a laser optical output has maximum value Pmax at first driving current value I1 and the laser optical output is at most 20% of maximum value Pmax at second driving current value I2, and which would not be damaged at second driving current value I2. Here, it is estimated that damage to a semiconductor laser element caused by energizing the semiconductor laser element at second driving current value I2 mainly occurs due to a defect present inside the semiconductor laser element. Therefore, the testing method according to the embodiment makes it possible to select a semiconductor laser element free of defects and damage inside the semiconductor laser element. Maximum value Pmax of a laser optical output of the semiconductor laser element may be at least 200 mW. With this, it is possible to realize a high-output semiconductor laser. In addition, maximum value Pmax of a laser optical output of the semiconductor laser element may be at least 300 mW. With this, it is possible to realize a semiconductor laser with even higher output.

Figure 22A:
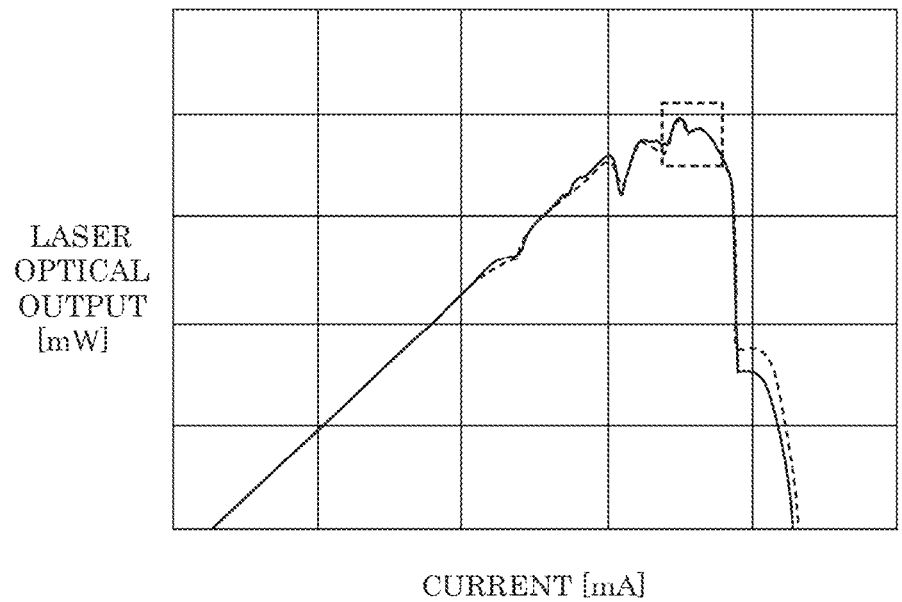
FIG. 22A is a graph showing the current-laser optical output characteristic of the semiconductor laser element to be tested according to Embodiment 1.
Figure 22B:
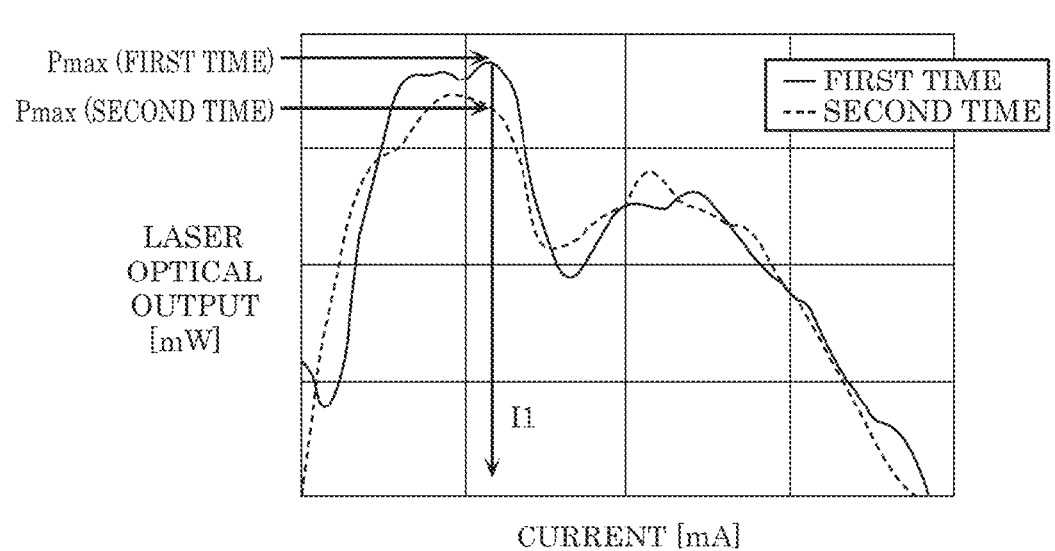
FIG. 22B is a partially enlarged view of FIG. 22A.

It should be noted that the testing method according to the embodiment is not limited to the above-described method. For example, in steps S10 and S30, maximum value Pmax of a laser optical output may be measured instead of measuring first test current value Ia and second test current value Ib which are supplied to a semiconductor laser element to be tested when the laser optical output is first output Pw1. FIG. 22A is a graph showing a current-laser optical output characteristic of the semiconductor laser element to be tested according to the embodiment in connection with such a measurement example. FIG. 22B is a partially enlarged view of FIG. 22A FIG. 22B is an enlarged view of an inside of the broken-line frame in FIG. 22A In FIG. 22A and FIG. 22B, the solid lines denote the first measurement result, and the broken lines denote the second measurement result.

As illustrated in FIG. 22A and FIG. 22B, the first measurement of a current-laser optical output characteristic may be performed in step S10, and subsequent to the energization performed in step S20, the second measurement of a current-laser optical output characteristic may be performed in step S30. It may be determined that the semiconductor laser element to be tested is non-defective when a laser optical output has maximum value Pmax at first driving current value I1 in the first measurement, and the laser optical output that is driven at first driving current value I1 for the second time is at least 95% of maximum value Pmax after the semiconductor laser element to be tested is driven at second driving current value I2 in step S20.

In addition, it may be determined that the semiconductor laser element to be tested is non-defective when the laser optical output is at least twice the absolute maximum rated optical output at first driving current value I1 when the semiconductor laser element to be tested is driven at first driving current value I1 for the second time. It should be noted that the absolute maximum rated optical output here means the maximum optical output allowed under the normal use of semiconductor laser elements.

With these testing methods, it is possible to select semiconductor laser elements free of internal deterioration.

In addition, in step S10 and step S30, a laser optical output of the semiconductor laser element to be tested may be measured in the case in which a current supplied to a semiconductor laser element to be tested is third test current value I3, instead of measuring first test current value Ia and second test current value Ib which are supplied to the semiconductor laser element to be tested when laser optical outputs each are first output Pw1. Specifically, when a current value supplied to the semiconductor laser element to be tested is third test current value I3 in step S10, it is estimated that the laser optical output is second output Pw2. In addition, when a current value supplied to the semiconductor laser element to be tested is third test current value I3 in step S30, it is estimated that the laser optical output is third output Pw3. Here, if third output Pw3 is at least 93% of second output Pw2 in step S40, it may be determined that a semiconductor laser element to be tested is non-defective.

With such testing method, it is possible to select semiconductor laser elements free of internal deterioration.

Embodiment 2

A semiconductor laser element according to Embodiment 2 will be described. The semiconductor laser element according to this embodiment is different from semiconductor laser element 14 according to Embodiment 1 mainly in the composition of active layer 40. Hereinafter, differences between the semiconductor laser element according to the embodiment and semiconductor laser element 14 according to Embodiment 1 will be mainly described.

Active layer 40 of the semiconductor laser element according to the embodiment includes a well layer containing $In_xGa_{1-x}As$ (0.01≤x≤0.1). In order to achieve the oscillation wavelength of 830 nm using such a well layer, it is necessary to make the well layer relatively thick. In other words, the thickness of a GaAs-based material having a slow diffusion rate of Zn, which is a window region formation impurity, increases. For this reason, the time required for the formation of window regions 80 having a desired energy band gap increases. Accordingly, the concentration of Zn that is diffused in active layer 40 increases, thereby increasing optical loss in active layer 40. For this reason, the use of AlGaInP having a faster diffusion rate of Zn for each of light guiding layers is also effective in this embodiment as in Embodiment 1.

Hereinafter, examples of the composition of respective layers in semiconductor layer 100 according to the embodiment will be described.

As illustrated in FIG. 2, first semiconductor layer 30 in the embodiment includes n-type buffer layer 31, n-type clad layer 32, and n-side light guiding layer 33. N-type buffer layer 31 is an n-GaAs layer having a thickness of 0.4 μm. N-type clad layer 32 is an n-$(Al_{0.17}Ga_{0.83})_{0.5}In_{0.5}P$ layer having a thickness of 4.7 μm. N-side light guiding layer 33 is a $Ga_{0.5}In_{0.5}P$ layer having a thickness of 0.09 μm.

Active layer 40 is a multi-quantum well active layer that includes, from the n-side light guiding layer 33 side, an $Al_{0.59}Ga_{0.41}As$ barrier layer having a thickness of 0.024 μm, an $In_{0.03}Ga_{0.97}As$ well layer having a thickness of 0.0055 μm, an $Al_{0.59}Ga_{0.41}As$ barrier layer having a thickness of 0.004 μm, an $In_{0.03}Ga_{0.97}As$ well layer having a thickness of 0.0055 μm, and an $Al_{0.59}Ga_{0.41}As$ barrier layer having a thickness of 0.021 μm.

Second semiconductor layer 50 includes p-side light guiding layer 51, p-type first clad layer 52, p-type second clad layer 53, p-type third clad layer 54, p-type middle layer 55, and p-type contact layer 56. P-side light guiding layer 51 is a $Ga_{0.5}In_{0.5}P$ layer having a thickness of 0.07 μm. P-type first clad layer 52 is a p-$(Al_{0.30}Ga_{0.70})_{0.5}In_{0.5}P$ layer having a thickness of 0.18 μm. P-type second clad layer 53 is a p-$(Al_{0.60}Ga_{0.40})_{0.5}In_{0.5}P$ layer having a thickness of 0.4 μm. P-type third clad layer 54 is a p-$(Al_{0.30}Ga_{0.70})_{0.5}In_{0.5}P$ layer having a thickness of 0.6 μm. P-type middle layer 55 is a p-$(Al_{0.1}Ga_{0.9})_{0.5}In_{0.5}P$ layer having a thickness of 0.106 μm. The Al composition of p-type middle layer 55 is lower than that of p-type third clad layer 54. P-type contact layer 56 is a p-GaAs layer having a thickness of 0.23 μm.

The semiconductor laser element having such a configuration as described above can demonstrate the same effects as semiconductor laser element 14 according to Embodiment 1.

Embodiment 3

A semiconductor laser element according to Embodiment 3 will be described. The semiconductor laser element according to this embodiment is different from semiconductor laser element 14 according to Embodiment 1 mainly in the composition of active layer 40. Hereinafter, differences between the semiconductor laser element according to the embodiment and semiconductor laser element 14 according to Embodiment 1 will be mainly described.

The oscillation mode of semiconductor laser elements according to the foregoing Embodiment 1 and Embodiment 2 is the transverse electric (TE) mode. The oscillation mode of the semiconductor laser element according to the embodiment is the transverse magnetic (TM) mode. For this reason, it is necessary to make the well layers in active layer 40 thick. This increases the thickness of a GaAs-based material having a slow diffusion rate of Zn, which is a window region formation impurity. For this reason, the time required for the formation of window regions 80 having a desired energy band gap increases. Accordingly, the concentration of Zn that is diffused in active layer 40 increases, thereby increasing optical loss in active layer 40. For this reason, the use of AlGaInP having a faster diffusion rate of Zn for each of light guiding layers is also effective in the embodiment as in Embodiment 1.

Hereinafter, examples of the composition of respective layers in semiconductor layer 100 according to the embodiment will be described.

As illustrated in FIG. 2, first semiconductor layer 30 in the embodiment includes n-type buffer layer 31, n-type clad layer 32, and n-side light guiding layer 33. N-type buffer layer 31 is an n-GaAs layer having a thickness of 0.4 μm. N-type clad layer 32 is an n-$(Al_{0.19}Ga_{0.81})_{0.5}In_{0.5}P$ layer having a thickness of 4.7 μm. N-side light guiding layer 33 is a $Ga_{0.5}In_{0.5}P$ layer having a thickness of 0.09 μm.

Active layer 40 is a multi-quantum well active layer that includes GaAsP well layers having tensile strain. Active layer 40 includes, from the n-side light guiding layer 33 side, an $Al_{0.59}Ga_{0.41}As$ barrier layer having a thickness of 0.04 μm, a $GaAs_{0.84}P_{0.16}$ well layer having a thickness of 0.0065 μm, an $Al_{0.59}Ga_{0.41}As$ barrier layer having a thickness of 0.008 μm, a $GaAs_{0.84}P_{0.16}$ well layer having a thickness of 0.0065 μm, an $Al_{0.59}Ga_{0.41}As$ barrier layer having a thickness of 0.008 μm, a $GaAs_{0.84}P_{0.16}$ is well layer having a thickness of 0.0065 μm, and an $Al_{0.59}Ga_{0.41}As$ barrier layer having a thickness of 0.021 μm. Tensile strain placed in active layer 40 makes it possible to develop a semiconductor laser element that performs the TM mode oscillation.

Second semiconductor layer 50 includes p-side light guiding layer 51, p-type first clad layer 52, p-type second clad layer 53, p-type third clad layer 54, p-type middle layer 55, and p-type contact layer 56. P-side light guiding layer 51 is a $Ga_{0.5}In_{0.5}P$ layer having a thickness of 0.07 μm. P-type first clad layer 52 is a p-$(Al_{0.30}Ga_{0.70})_{0.5}In_{0.5}P$ layer having a thickness of 0.16 μm. P-type second clad layer 53 is a p-$(Al_{0.60}Ga_{0.40})_{0.5}In_{0.5}P$ layer having a thickness of 0.4 μm. P-type third clad layer 54 is a p-$(Al_{0.30}Ga_{0.70})_{0.5}In_{0.5}P$ layer having a thickness of 0.6 μm. P-type middle layer 55 is a p-$(Al_{0.1}Ga_{0.9})_{0.5}In_{0.5}P$ layer having a thickness of 0.106 μm. The Al composition of p-type middle layer 55 is lower than that of p-type third clad layer 54. P-type contact layer 56 is a p-GaAs layer having a thickness of 0.23 μm.

The semiconductor laser element having such a configuration as described above can demonstrate the same effect as semiconductor laser element 14 according to Embodiment 1.

Variation, Etc.

The foregoing has described the semiconductor laser elements etc. according to the embodiments, yet the present disclosure is not limited to the above embodiments.

For example, the present disclosure also encompasses: embodiments achieved by applying various modifications conceivable to those skilled in the art to each embodiment; and embodiments achieved by optionally combining the structural elements and the functions of each embodiment without departing from the essence of the present disclosure.

For example, the testing methods according to the above embodiments are applicable to a semiconductor laser element to be tested in an optional mounting state. For example, the above-described testing method can be employed with testing device 200 in the case where a semiconductor laser element to be tested is in a state as illustrated in FIG. 14 or in a discrete state in which a semiconductor laser element to be tested is not placed on submount 104. In addition, when a semiconductor laser element to be tested is in a state different from the above, such as a CAN-packaged state in which submount 104 is provided on a stem, and a state in which the semiconductor laser element to be tested is provided in a frame package, the above testing method can be applied by modifying the testing device in accordance with those states.

In addition, although a ridged structure is used for the formation of a waveguide in the semiconductor laser elements according to the above embodiments and the variation, the means of the waveguide formation is not limited to the above. Instead, an embedded structure etc. may be used.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor laser elements etc. according to the present disclosure is particularly useful in light sources etc. that require reliability.

What is claimed is:

1. A semiconductor laser element, comprising a semiconductor layer, wherein
the semiconductor layer includes:
a waveguide formed in an intra-layer direction of the semiconductor layer; and
a window region formed in at least a front-side end face of the waveguide among the front-side end face and a rear-side end face of the waveguide,
the semiconductor layer includes an n-type clad layer containing n-type AlGaInP, an n-side light guiding layer, an active layer including a quantum well structure, a p-side light guiding layer, and a p-type clad layer containing p-type AlGaInP which are formed in a stated order,
the quantum well structure includes a well layer and a barrier layer, wherein the barrier layer contains AlGaAs, and
the p-side light guiding layer and the n-side light guiding layer each contain $Al_y Ga_z In_{(1-y-z)}P$, y being at least 0 and at most 0.1, z being at least 0 and at most 0.9, y+z being at least 0.3 and at most 0.7.

2. The semiconductor laser element according to claim 1, wherein
a resonator length of the semiconductor laser element is at most 300 μm.

3. The semiconductor laser element according to claim 1, wherein
an oscillation wavelength of the semiconductor laser element is at least 780 nm and at most 860 nm.

4. The semiconductor laser element according to claim 1, comprising a substrate above which the semiconductor layer is disposed, the substrate containing GaAs, wherein
the semiconductor layer is formed above the substrate.

5. The semiconductor laser element according to claim 1, wherein
the well layer contains GaAs, InGaAs, or GaAsP.

6. The semiconductor laser element according to claim 1, wherein
the window region includes a window region formation impurity, and
a distance from an active layer lower end to a lower diffusion end of the window region formation impurity in the window region is at least 0.5 μm, the active layer lower end being a boundary between the n-side light guiding layer and the active layer the lower diffusion end being on an opposite side of the p-side light guiding layer with the active layer interposed therebetween.

7. The semiconductor laser element according to claim 1, wherein
the window region includes a lower end that is located within the n-type clad layer.

8. The semiconductor laser element according to claim 1, wherein
the window region includes a disordered region in which a portion of the quantum well structure is disordered, and
a difference between an energy band gap in the disordered region and an energy band gap in a remaining portion of the quantum well structure is at least 30 meV.

9. The semiconductor laser element according to claim 3, wherein
a peak wavelength of a spectrum from the window region is at least 30 nm shorter than the oscillation wavelength, the peak wavelength of the spectrum being obtained by a photoluminescence method or a cathodoluminescence method.

10. The semiconductor laser element according to claim 1, wherein
the window region includes a window region formation impurity, and
a peak concentration of the window region formation impurity of a portion located in the window region within the active layer is at least $7 \times 10^{18}/cm^3$ and at most $1 \times 10^{19}/cm^3$.

11. The semiconductor laser element according to claim 1, wherein
an average concentration of a window region formation impurity of a portion located inside the window region within the p-type clad layer is at most six times an average concentration of the window region formation impurity of a portion outside the window region within the p-type clad layer.

12. The semiconductor laser element according to claim 1, wherein
a length of the window region formed in the front-side end face of the waveguide is greater than a length of the window region formed in the rear-side end face of the waveguide, the length of the window region formed in the front-side end face of the waveguide being in a lengthwise direction of the waveguide, the length of the window region formed in the rear-side end face of the waveguide being in the lengthwise direction of the waveguide.

13. The semiconductor laser element according to claim 1, wherein
the semiconductor layer includes a p-type contact layer disposed above the p-type clad layer.

14. The semiconductor laser element according to claim 13, wherein
the semiconductor layer includes a p-type middle layer that is interposed between the p-type clad layer and the p-type contact layer.

15. The semiconductor laser element according to claim 1, wherein
the p-type clad layer includes a plurality of layers having mutually different compositions.

16. The semiconductor laser element according to claim 2, wherein
an oscillation wavelength of the semiconductor laser element is at least 780 nm and at most 860 nm.

17. The semiconductor laser element according to claim 2, wherein
the well layer contains GaAs, InGaAs, or GaAsP.

18. The semiconductor laser element according to claim 2, wherein
the window region includes a disordered region in which a portion of the quantum well structure is disordered, and
a difference between an energy band gap in the disordered region and an energy band gap in a remaining portion of the quantum well structure is at least 30 meV.

19. The semiconductor laser element according to claim 2, wherein
the window region includes a window region formation impurity, and
a peak concentration of the window region formation impurity of a portion located in the window region within the active layer is at least $7 \times 10^{18}/cm^3$ and at most $1 \times 10^{19}/cm^3$.

20. The semiconductor laser element according to claim 2, wherein
a length of the window region formed in the front-side end face of the waveguide is greater than a length of the window region formed in the rear-side end face of the waveguide, the length of the window region formed in the front-side end face of the waveguide being in a lengthwise direction of the waveguide, the length of the window region formed in the rear-side end face of the waveguide being in the lengthwise direction of the waveguide.

* * * * *